(12) United States Patent
Lindorfer et al.

(10) Patent No.: US 9,201,124 B2
(45) Date of Patent: Dec. 1, 2015

(54) DIE-SIZED ATOMIC MAGNETOMETER AND METHOD OF FORMING THE MAGNETOMETER

(75) Inventors: Philipp Lindorfer, San Jose, CA (US);
Peter J. Hopper, San Jose, CA (US);
William French, San Jose, CA (US);
Paul Mawson, Los Gatos, CA (US);
Steven Hunt, San Jose, CA (US);
Roozbeh Parsa, San Jose, CA (US)

(73) Assignee: NATIONAL SEMICONDUCTOR CORPORATION, Santa Clara, CA (US)

( * ) Notice: Subject to any disclaimer, the term of this patent is extended or adjusted under 35 U.S.C. 154(b) by 1117 days.

(21) Appl. No.: 13/182,510

(22) Filed: Jul. 14, 2011

(65) Prior Publication Data

US 2013/0015850 A1 Jan. 17, 2013

(51) Int. Cl.
*G01R 33/02* (2006.01)
*G01R 33/032* (2006.01)
*G01J 1/44* (2006.01)
*G01J 5/20* (2006.01)
*G01J 1/42* (2006.01)
*H01S 5/026* (2006.01)
*H01S 5/183* (2006.01)

(52) U.S. Cl.
CPC ............ *G01R 33/032* (2013.01); *G01J 1/4228* (2013.01); *G01J 1/44* (2013.01); *G01J 5/20* (2013.01); *H01S 5/0261* (2013.01); *H01S 5/026* (2013.01); *H01S 5/183* (2013.01)

(58) Field of Classification Search
None
See application file for complete search history.

(56) References Cited

U.S. PATENT DOCUMENTS

| 7,826,065 | B1 * | 11/2010 | Okandan et al. ............... 356/521 |
| 2006/0227845 | A1 * | 10/2006 | Degertekin et al. ............ 372/102 |
| 2007/0266784 | A1 * | 11/2007 | Lust et al. ................... 73/504.05 |

OTHER PUBLICATIONS

Schwindt, Peter D. D. et al., "Chip-scale atomic magnetometer with improved sensitivity by use of the Mx technique", Applied Physics Letters, 90, 2007, pp. 081102-1 through 081102-3.
Jimenez-Martinez, Ricardo et al., "Sensitivity Comparison of Mx and Frequency-Modulated Bell-Bloom Cs Magnetometers in a Microfabricated Cell", IEEE Transactions on Instrumentation and Measurement, vol. 59, No. 2, 2010, pp. 372-378.
Woetzel, S., "Microfabricated atomic vapor cell arrays for magnetic field measurements", Review of Scientific Instruments, 82, 2011, pp. 033111-1 through 033111-4.
Knappe, Svenja A. et al., "Microfabricated saturated absorption laser spectrometer", Optics Express, vol. 15, No. 10, 2007, pp. 6293-6299.
Knappe, Svenja, "MEMS Atomic Clocks", Comprehensive Microsystems, vol. 3, 2007, pp. 571-612.

(Continued)

*Primary Examiner* — Melissa Koval
*Assistant Examiner* — Stephen G Armstrong
(74) *Attorney, Agent, or Firm* — Jacqueline J. Garner; Frank D. Cimino

(57) ABSTRACT

The cost and size of an atomic magnetometer are reduced by attaching together a first die which integrates together a vapor cell, top and side photo detectors, and processing electronics, a second die which integrates together an optics package and a heater for the vapor cell, and a third die which integrates together a VCSEL, a heater for the VCSEL, and control electronics.

24 Claims, 27 Drawing Sheets

(56) References Cited

OTHER PUBLICATIONS

Prouty, Mark, "Final Report Development of a Micro-Fabricated Total-Field Magnetometer", Strategic Environmental Research and Development Program (SERDP) Project MR-1512 [online], Mar. 2011, pp. i-xi and 1-162 [retrieved on Jul. 13, 2011]. Retrieved from the Internet:<URL: http://www.serdp.org/Program-Areas/Munitions-Response/Land/Sensors/MR-1512/MR-1512-FR>.

Kitching, John et al., "Chip-Scale Atomic Devices", Solid-State Sensors, Actuators, and Microsystems Workshop, 2006, pp. 108-113.

Schwindt, Peter D. D. et al., "Chip-scale atomic magnetometer", Applied Physics Letters, vol. 85, No. 26, 2004, pp. 6409-6411.

* cited by examiner

DIE-SIZED ATOMIC MAGNETOMETER AND METHOD OF FORMING THE MAGNETOMETER

BACKGROUND OF THE INVENTION

1. Field of the Invention

The present invention relates to atomic magnetometers and, more particularly, to a die-sized atomic magnetometer and a method of forming the magnetometer.

2. Description of the Related Art

An atomic magnetometer is a device that measures the strength of a magnetic field by determining a frequency known as the Larmor frequency. The Larmor frequency, in turn, is the frequency of the magnetic moment of a contained group of in-phase spinning alkali atoms moving in precession in response to the magnetic field. A magnetic field strength B is defined by the equation $B=hv_L/\gamma$, where h is Plank's constant, $hv_L$ is the Larmor frequency, and $\gamma$ is the gyromagnetic ratio (e.g., 7 Hz/nT for $^{87}$Rb and 3.5 Hz/nT for Cs).

FIG. 1 shows a block diagram that illustrates an example of a prior art atomic magnetometer 100. As shown in FIG. 1, atomic magnetometer 100 includes a vertical cavity surface emitting laser (VCSEL) 110, and an optics package 112 that lies above VCSEL 110. Further, atomic magnetometer 100 also includes a vapor cell 114 that lies above optics package 112, and a photo detector 116 that lies above vapor cell 114.

In addition, vapor cell 114 contains a gas 118 that includes alkali atoms, which have a single electron in the outer shell, and buffer atoms, which reduce collisions between the alkali atoms and the inner surface of vapor cell 114. For example, vapor cell gas is commonly implemented with alkali atoms such as $^{85}$Rb atoms, $^{87}$Rb atoms, and Cs atoms, and buffer atoms such as $N_2$. Further, atomic magnetometer 100 can optionally include a lower coil 120 and an upper coil 122 that lie below and above vapor cell 114.

In operation, VCSEL 110 outputs light which is attenuated and circularly polarized by optics package 112. The circularly polarized light output by optics package 112 is then directed into vapor cell 114. The light output by VCSEL 110 is tuned to a frequency which, when circularly polarized, is absorbed by the single electrons in the outer shells of the alkali atoms in the gas 118 contained within vapor cell 114. For example, VCSEL 110 can be tuned to output light with a wavelength of 795 nm which, after being circularly polarized, is absorbed by the single electrons in the outer shells of $^{87}$Rb atoms.

When the single electron in the outer shell of an alkali atom absorbs light energy, the electron transitions to a higher energy level, and then falls back to one of a number of energy levels (Zeeman sublevels within the hyperfine energy levels) that are associated with the outer shell. When falling back, the electron emits a photon in a random direction, and always falls back to the highest energy level that is associated with the outer shell.

When the electron falls back to the highest energy level that is associated with the outer shell, the electron is no longer capable of absorbing any light energy. To again reabsorb light, additional energy at the Larmor frequency must be applied to the electron. The additional energy at the Larmor frequency causes the electron to drop to a lower energy level that is associated with the outer shell where the electron can again absorb light energy.

Thus, the photons that pass out of vapor cell 114 into photo detector 116 include a non-absorption component, which represents the light output by VCSEL 110 that was not absorbed by the electrons in the outer shell of the gas 118 within vapor cell 114, and an emission component, which represents the photons that are randomly emitted by the falling electrons. Photo detector 116 detects these photons, and generates an output signal that has both a non-absorption component and an emission component.

Two of the common approaches to adding additional energy at the Larmor frequency are the Bell-Bloom (BB) technique and the $M_X$ technique. In the BB technique, the light output by VCSEL 110 is modulated by a frequency that is swept across a range of frequencies. When the light output by VCSEL 110 is frequency modulated at the Larmor frequency, the electrons drop to a lower energy level and begin reabsorbing light energy, which causes a noticeable dip in the intensity of light received by photo detector 116. Thus, the Larmor frequency can be determined by determining the modulated frequency that caused the intensity of the received light to dip.

In the $M_X$ technique, an RF signal is applied to the lower and upper coils 120 and 122 to create an alternating magnetic field that is aligned with the longitudinal axis of the light emitted by VCSEL 110, while the frequency of the RF signal is swept across a range of frequencies. When the frequency of the RF signal becomes equal to the Larmor frequency, the electrons drop to a lower energy level and begin reabsorbing light energy, which causes a noticeable dip in the intensity of light received by photo detector 116. Thus, the Larmor frequency can be determined by determining the RF frequency that caused the intensity of the received light to dip.

Two of the drawbacks of conventional atomic magnetometers are size and cost, which then limit the types of applications where atomic magnetometers can be commercially utilized. Thus, there is a need for die-sized atomic magnetometers which can be mass produced in conventional integrated circuit fabrication facilities, thereby reducing both size and cost and significantly increasing the types of applications where atomic magnetometers can be commercially utilized.

DETAILED DESCRIPTION OF THE INVENTION

Figure 1:
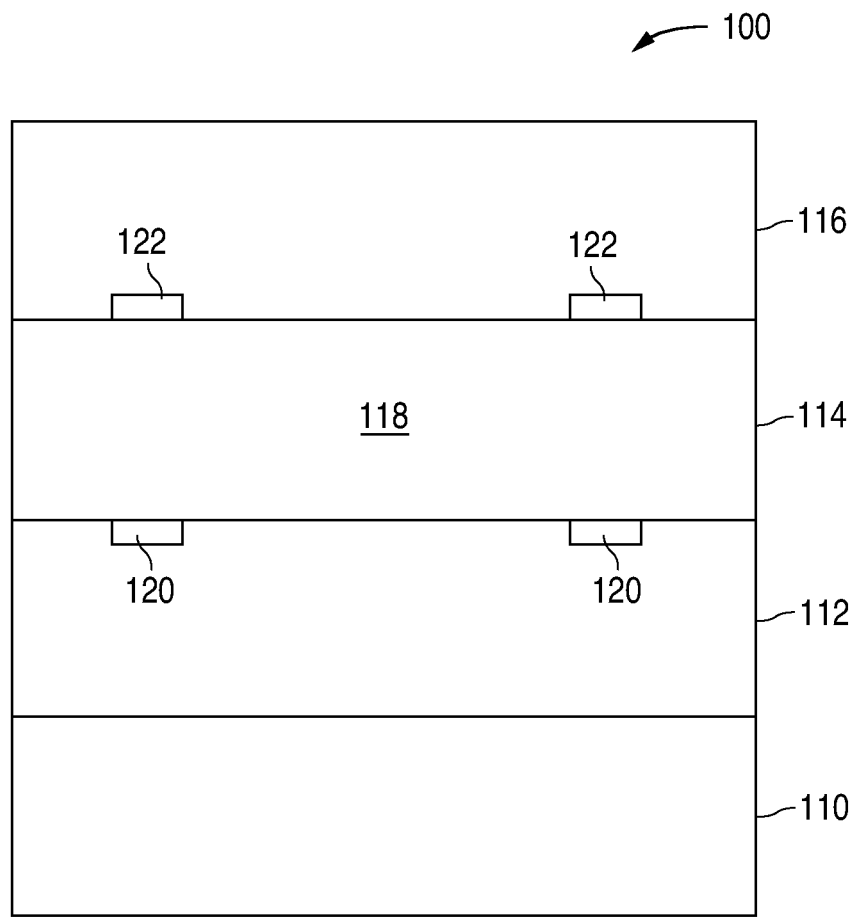
FIG. 1 is a block diagram illustrating an example of a prior art atomic magnetometer 100.
Figure 2A:
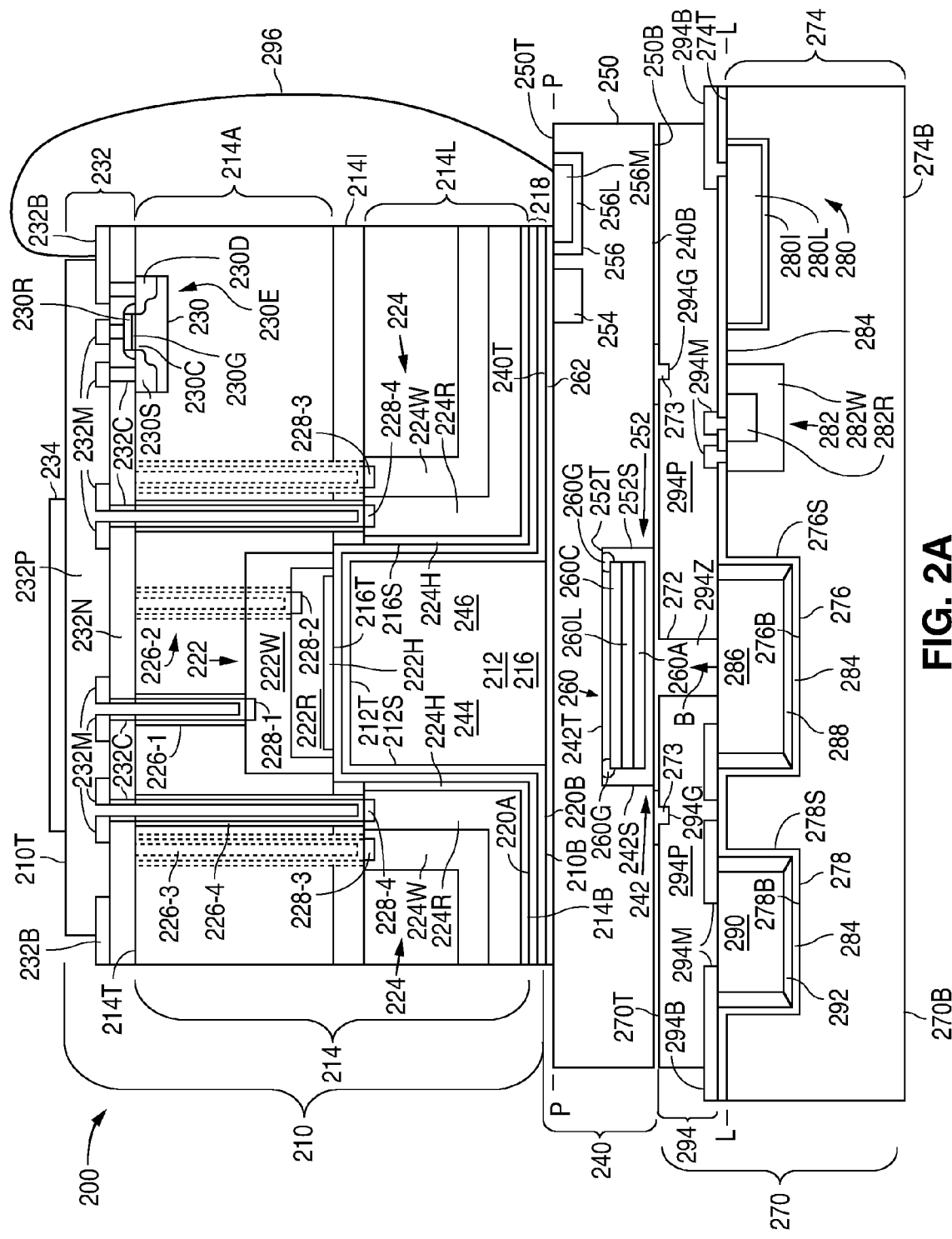
FIG. 2A is a cross-sectional view illustrating an example of a die-sized atomic magnetometer 200 in accordance with the present invention.

FIG. 2A shows a cross-sectional view that illustrates an example of a die-sized atomic magnetometer 200 in accordance with the present invention. As shown in FIG. 2A, atomic magnetometer 200 includes a first die 210 that has a top surface 210T, a bottom surface 210B, and a first die cavity 212 that extends into first die 210 from the bottom surface 210B of first die 210. First die cavity 212, in turn, has a top surface 212T and a side wall surface 212S. The top surface 212T of first die cavity 212 lies below and spaced apart from the top surface 210T of first die 210.

As further shown in FIG. 2A, first die 210 includes a first semiconductor structure 214 that has a top surface 214T, a bottom surface 214B, and a first semiconductor cavity 216 that extends into first semiconductor structure 214 from the bottom surface 214B of first semiconductor structure 214. First semiconductor cavity 216, in turn, has a top surface 216T and a side wall surface 216S. The top surface 216T of first semiconductor cavity 216 lies below and spaced apart from the top surface 214T of first semiconductor structure 214.

First die 210 also includes a heat spreader 218 that touches the bottom surface 214B of first semiconductor structure 214 and the top surface 216T and the side wall surface 216S of first semiconductor cavity 216 to line first semiconductor cavity 216. Heat spreader 218 is highly thermally conductive, and has a thermal conductivity that is substantially greater than copper, which has a thermal conductivity that is substantially greater than single-crystal silicon.

In the present example, heat spreader 118 is implemented with an oxide layer 220A and an overlying diamond layer 220B. Diamond, in turn, has a thermal conductivity that is 5-10× greater than copper. Further, the bottom surface of heat spreader 218 (or the exterior surface of diamond layer 220B) forms the bottom surface 210B of first die 210. Heat spreader 118 can also optionally include other or additional layers to, for example, improve adhesion, provide greater thermal conductivity, or to reduce the effect of atomic collisions with the exterior surface of heat spreader 118 within the cavity.

In the FIG. 2A example, first semiconductor structure 214 is implemented with a silicon-on-insulator (SOI) structure that has a p-type single-crystal silicon bulk region 214L, an insulator 214I that touches the top surface of bulk region 214L, and a p-type single-crystal silicon active region 214A that touches the top surface of insulator 214I. First semiconductor cavity 216 extends through bulk region 214L and insulator 214I to expose the bottom surface of active region 214A. As a result, the top surface 216T of first semiconductor cavity 216 is the exposed bottom surface of active region 214A. Alternately, first semiconductor cavity 214 can only extend through bulk region 214L. In this case, the top surface 216T of first semiconductor cavity 216 is the exposed bottom surface of insulator 214I.

First semiconductor structure 214 also has an upper photo detector 222 that lies vertically between the top surface 214T of first semiconductor structure 214 and the top surface 216T of first semiconductor cavity 216. Upper photo detector 222 has a p-type well 222W and an n-type region 222R that touches first well 222W.

The dopant concentration of p-type well 222W is greater than the dopant concentration of p-type active region 214A. Further, in the FIG. 2A example, upper photo detector 222 also has a thin p+ region 222H that touches n-type region 222R. Thin p+ region 222H reduces surface recombination.

In addition, first semiconductor structure 214 has a side wall photo detector 224 that lies horizontally adjacent to and touches the side wall surface 216S of first semiconductor cavity 216. Side wall photo detector 224 has a p-type well 224W and an n-type region 224R that touches n-type well 224W.

The dopant concentration of p-type well 224W is greater than the dopant concentration of p-type bulk region 214L. Further, in the FIG. 2A example, side wall photo detector 224 also has a thin p+ region 224H that touches n-type region 224R. Thin p+ region 224H reduces surface recombination.

First semiconductor structure 214 additionally has a number of first photo detector contact structures 226-1 that each extends from the top surface 214T of first semiconductor structure 214 into first semiconductor structure 214 to make electrical connections with p-type well 222W, and a number of second photo detector contact structures 226-2 that each extends from the top surface 214T of first semiconductor structure 214 into first semiconductor structure 214 to make electrical connections with n-type region 222R.

First semiconductor structure 214 further has a number of third photo detector contact structures 226-3 that each extends from the top surface 214T of first semiconductor structure 214 into first semiconductor structure 214 to make electrical connections with p-type well 224W, and a number of fourth photo detector contact structures 226-4 that each extends from the top surface 214T of first semiconductor structure 214 into first semiconductor structure 214 to make electrical connections with n-type region 224R. (Contact structure 226-2 and contact structure 226-3 are shown with dashed lines to indicate that the structures lie above and below the plane of the page.) In the present example, each of the photo detector contact structures 226 is implemented with an inner layer of oxide and an outer layer of metal which, in turn, can include tungsten.

In addition, first semiconductor structure 214 has a p+ contact region 228-1 that touches p-well 222W and contact structure 226-1, and an n+ contact region 228-2 that touches n-type region 222R and contact structure 226-2. First semiconductor structure 214 also has a p+ contact region 228-3 that touches p-well 224W and contact structure 226-3, and an n+ contact region 228-4 that touches n-type region 224R and contact structure 226-4.

Further, first semiconductor structure 214 has a number of circuit elements 230 that are formed in and on the top surface 214T of first semiconductor structure 214. The circuit elements 230 include transistors, resistors, capacitors, diodes and similar circuit devices. (For simplicity, only one NMOS transistor 230, which has an n-type source 230S and an n-type drain 230D spaced apart by a p-type channel 230C, a gate oxide layer 230G that touches the top surface 214T of first semiconductor structure 214 over channel 230C, and a gate 230R that touches oxide layer 230G over channel 230C, is illustrated.) When electrically connected together, the circuit elements 230 form an electronic circuit 230E that processes the signals output by upper photo detector 222 and side wall photo detector 224.

Figure 2B:
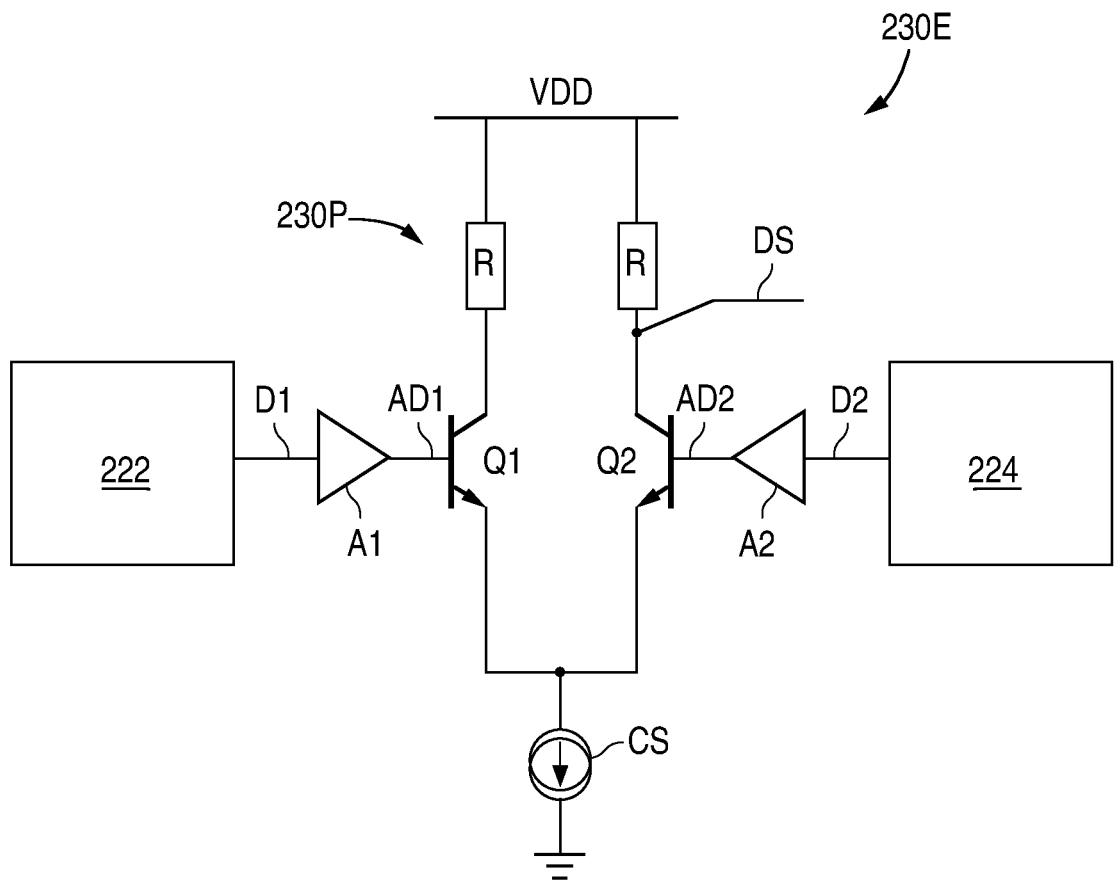
FIG. 2B is a schematic diagram illustrating an example of electronic circuit 230E in accordance with the present invention.

FIG. 2B shows a schematic diagram that illustrates an example of electronic circuit 230E in accordance with the present invention. As shown in FIG. 2B, photo detector 222 and side wall photo detector 224 generate photo detect signals D1 and D2, respectively, which represent detected light, while electronic circuit 230E includes amplifiers A1 and A2 that amplify the photo detect signals D1 and D2, respectively, to generate the amplified photo detect signals AD1 and AD2.

In addition, electronic circuit 230E includes a differential pair circuit 230P that has a first transistor Q1 with a base connected to receive the amplified photo detect signal AD1, and a second transistor Q2 with a base connected to receive the amplified photo detect signal AD2. Further, first and second transistors Q1 and Q2 each have a collector that is connected to a power supply voltage VDD by way of a resistive element R, and emitters that are connected together, and to a current source CS. The output is taken at the collector of transistor Q2.

Referring again to FIG. 2A, first die 210 also has an interconnect structure 232 that touches the top surface 214T of first semiconductor structure 214 and the circuit elements 230. Interconnect structure 232 includes a non-conductive region 232N, and contacts 232C that extend through region 232N to make electrical connections with the circuit elements 230 and the first, second, third, and fourth photo detector contact structures 226-1, 226-2, 226-3, and 226-4. In addition, interconnect structure 232 includes a number of metal-1 traces 232M that lie on region 232N and touch the contacts 232C, and a passivation layer 232P that covers non-conductive region 232N and the metal-1 traces 232M.

Interconnect structure 232 electrically connects the circuit elements 230 to the first, second, third, and fourth photo detector contact structures 226-1, 226-2, 226-3, and 226-4. In addition, portions of the metal-1 traces 232M are exposed to form metal bond pads 232B for external electrical connections. (Although interconnect structure 232 is shown with a single metal layer, additional metal layers can also be used.) Further, first die 210 can optionally include a mirror 234 that touches the top surface of interconnect structure 232 and lies over first die cavity 212 and first semiconductor cavity 216.

As further shown in FIG. 2A, atomic magnetometer 200 also includes a second die 240 that has a top surface 240T, a bottom surface 240B, and a second die cavity 242 that extends into second die 240 from the bottom surface 240B of second die 240. Second die cavity 242, in turn, has a top surface 242T and a side wall surface 242S.

The top surface 242T of second die cavity 242 lies below and spaced apart from the top surface 240T of second die 240. In addition, the top surface 240T of second die 240 is attached to the bottom surface 210B of first die 210. The top surface 240T of second die 240 touches the bottom surface 210B of first die 210 to close first die cavity 212 and form a vapor cell 244, which is hermetically sealed.

Atomic magnetometer 200 further includes a gas 246 that is contained within hermetically-sealed vapor cell 244. Gas 246, in turn, includes alkali atoms and buffer atoms. For example, gas 246 can be implemented with alkali atoms such as $^{85}$Rb atoms, $^{87}$Rb atoms, or Cs atoms, and buffer atoms such as $N_2$.

As additionally shown in FIG. 2A, second die 240 includes a second semiconductor structure 250 that has a top surface 250T, a bottom surface 250B, and a second semiconductor cavity 252 that extends into second semiconductor structure 250 from the bottom surface 250B of second semiconductor structure 250.

Second semiconductor cavity 252, in turn, has a top surface 252T that coincides with the top surface 242T of second die cavity 242, and a side wall surface 252S that coincides with the side wall surface 242S of second die cavity 242. In addition, the bottom surface 250B of second semiconductor structure 250 coincides with the bottom surface 240B of second die 240. In the FIG. 2A example, second semiconductor structure 250 is implemented with a non-conductive material, such as borosilicate glass (BSG).

Second semiconductor structure 250 also has a heating element 254 and a pair of bond pads 256 that are electrically connected to the ends of heating element 254. (Only one portion of heating element 254 and one bond pad 256 are shown for simplicity.) In the FIG. 2A example, heating element 254 is implemented with a strip of undoped polysilicon that is laid out to minimize the magnetic field that is generated by current flowing through heating element 254. For example, heating element 254 can be laid out in long parallel strips with alternate ends connected together to form a serpentine pattern. In addition, the bond pads 256 are implemented with an undoped polysilicon outer layer 256L and a metallic inner region 256M.

As shown, the top surfaces of heating element 254 and the bond pads 256 lie in the same plane P as the top surface 250T of second semiconductor structure 250, while the bottom surfaces of heating element 254 and the bond pads 256 are vertically spaced apart from the bottom surface 250B of second semiconductor structure 250.

As further shown in FIG. 2A, second die 240 also includes an optics package 260 that is attached to the top surface 242T of second die cavity 242 (which is the top surface 252T of second semiconductor cavity 252). Optics package 260 can be attached with drops 260G of a conventional glue or die attach adhesive placed at the corners of optics package 260.

Optics package 260 outputs circularly polarized light in response to light received from a light source, and can be implemented with any arrangement that outputs circularly polarized light. In the FIG. 2A example, optics package 260 includes an attenuator 260A that reduces the intensity of the input light, a linear polarizer 260L that linearly polarizes the light output from attenuator 260A, and a quarter wave plate circular polarizer 260C that circularly polarizes the light output from linear polarizer 260L. Optics package 260 is commercially available from a number of sources, such as Thorlabs (www.thorlabs.com) or CVI Melles Griot (www.cvimellesgriot), which provide optics packages to meet customer specified requirements for the layers and exterior dimensions. (Thorlabs NE220B is an attenuator, Thorlabs LPVIS100 is a linear polarizer, and CVI Melles Griot QWPO-895-15-4 is a circular polarizer.)

In addition, second die 240 also includes a heat spreader 262 that touches the top surface 250T of second semiconductor structure 250. Heat spreader 262 is highly thermally conductive, and has a thermal conductivity that is substantially greater than copper, which has a thermal conductivity that is substantially greater than BSG.

In the present example, heat spreader 262 is implemented with a diamond layer. Diamond, in turn, has a thermal conductivity that is 5-10× greater than copper. Further, the top surface of heat spreader 262 (or the exterior surface of the diamond layer) forms the top surface 240T of second die 240. Heat spreader 262 can also optionally include other or additional layers to, for example, improve adhesion, provide greater thermal conductivity, or to reduce the effect of atomic collisions with the exterior surface of heat spreader 262 within the cavity. Thus, when the outer surfaces of heat spreader 118 and heat spreader 262 are both diamond, all of the interior surfaces of hermetically-sealed vapor cell 244 are implemented with the same material. Alternately, heat spreader 262 can be omitted.

As also shown in FIG. 2A, atomic magnetometer 200 further includes a third die 270 that has a top surface 270T, a bottom surface 270B, and a third die cavity 272 that extends into third die 270 from the top surface 270T of third die 270 to expose a laser light source. In addition, the top surface 270T of third die 270 is attached to the bottom surface 240B of second die 240 with drops 273 of a conventional glue or die attach adhesive to vertically align the first, second, and third die cavities 212, 242, and 272.

As further shown in FIG. 2A, third die 270 includes a third semiconductor structure 274 that has a top surface 274T, and a bottom surface 274B that coincides with the bottom surface 270B of third die 270. Third semiconductor structure 274 also has a third semiconductor cavity 276 and a fourth semiconductor cavity 278 that each extends into third semiconductor structure 274 from the top surface 274T of third semiconductor structure 274.

Third semiconductor cavity 276 has a bottom surface 276B and a side wall surface 276S, while fourth semiconductor cavity 278 has a bottom surface 278B and a side wall surface 278S. In the FIG. 2A example, third semiconductor structure 274 is implemented with a conventional substrate material, such as single crystal silicon.

Third semiconductor structure 274 also has a heating element 280. In the FIG. 2A example, heating element 280 is implemented with an insulating oxide outer layer 280I, and a strip of undoped polysilicon 280L that is laid out to minimize the magnetic field that is generated by current flowing through heating element 280. For example, heating element 280 can be laid out in long parallel strips with alternate ends connected together to form a serpentine pattern. As shown, the top surface of heating element 280 lies in the same plane L as the top surface 274T of third semiconductor structure 274, while the bottom surface of heating element 280 is vertically spaced apart from the bottom surface 274B of third semiconductor structure 274.

Third semiconductor structure 274 also includes a temperature sensor 282 that has a top surface which lies in the same plane L as the top surface 274T of third semiconductor structure 274. In the FIG. 2A example, temperature sensor 282 is implemented with a diode, which has a p-type well 282W and an n-type region 282R. The current through a diode varies in response to the temperature of the diode. (Although only one temperature sensor 282 is illustrated, additional temperature sensors can also be used.)

As further shown in FIG. 2A, third die 270 also includes a heat spreader 284 that touches the top surface 274T of third semiconductor structure 274, the bottom surface 276B and the side wall surface 276S of third semiconductor cavity 276 to line third semiconductor cavity 276, and the bottom surface 278B and the side wall surface 278S of fourth semiconductor cavity 278 to line fourth semiconductor cavity 278. Heat spreader 284 is highly thermally conductive, and has a thermal conductivity that is substantially greater than copper, which has a thermal conductivity that is substantially greater than single crystal silicon.

In the present example, heat spreader 284 is implemented with a diamond layer. Diamond, in turn, has a thermal conductivity that is 5-10× greater than copper. Heat spreader 284 can also optionally include other or additional layers to, for example, improve adhesion or provide greater thermal conductivity.

In the present example, the heat spreaders 218, 262, and 284 are also electrical isolators. As a result, heat spreader 284 has a number of openings that expose portions of heating element 280, and the contact regions of p-type well 282W and n-type region 282R. The openings, however, provide substantially no interruption to the thermal flow from heating element 280 to the portion of heat spreader 284 that lines third semiconductor cavity 276. In addition, the region of heat spreader 284 that lines fourth semiconductor cavity 278 can be optionally removed and replaced by a less thermally conductive material.

In addition, third die 270 has a conventionally-fabricated vertical cavity surface emitting laser (VCSEL) 286 that is attached to the bottom surface 276B of third semiconductor cavity 276 by an adhesive layer 288. Adhesive layer 288 can be implemented with a conventional glue or die attach adhesive. VCSEL 286 is commercially available from a number of sources, such as Princeton Optronics (www.princetonoptronics.com) or M-Com (www.m-com.com.tw/en), which provide VCSELs to meet customer specified requirements for light frequency, tuning range, power rating, and exterior dimensions.

Third die 270 also has an integrated circuit 290 that is attached to the top surface 278T of fourth semiconductor cavity 278 by an adhesive layer 292. Adhesive layer 292 can be implemented with a conventional glue or die attach adhesive. Integrated circuit 290 is a conventionally-fabricated die that includes one or more conventional electronic circuits that control the current flow through heating elements 254 and 280, detect the current flowing through temperature sensor 282, control the operation of VCSEL 286, and process the signals output by electronic circuit 230E.

Further, third die 270 has an interconnect structure 294 that touches the top surface of heat spreader 284. Interconnect structure 294, which includes metal-1 traces 294M and a non-conductive region 294P, electrically connects integrated circuit 290 to heating element 280, temperature sensor 282, and VCSEL 286.

As shown in FIG. 2A, interconnect structure 294 has an opening 294Z that extends through non-conductive region 294P to expose the laser output of VCSEL 286, and glue openings 294G. In addition, portions of the metal-1 traces 294M are exposed to form metal bond pads 294B for external electrical connections. (Although interconnect structure 294 is shown with a single metal layer, additional metal layers can also be used.)

As further shown in FIG. 2A, atomic magnetometer 200 additionally includes a number of bonding wires 296 which can electrically connect the metal bond pads (e.g., 232B, 256, and 294B) on the first, second, and third dice 210, 240, and 270 together as needed, and to external connections. (Only one bonding wire 296 is shown in the FIG. 2A example for simplicity.)

In the operation of atomic magnetometer 200, VCSEL 286 outputs a light beam B with a wavelength which, after being circularly polarized by optics package 260, is absorbed by the single electrons in the outer shells of the alkali atoms of the gas 246 within hermetically sealed vapor cell 244. The electrons jump to a higher energy level as the electrons absorb light energy, and then fall back emitting photons in random directions. In the FIG. 2A example, the Bell-Bloom (BB) technique is used to frequency modulate the light to identify the Larmor frequency and enable the electrons to again re-absorb light energy.

In the present invention, the light output by vapor cell 244 is detected not only by upper photo detector 222, but also by side wall photo detector 224. The photons that pass out of vapor cell 244 into upper photo detector 222 include a non-absorption component, which represents the light output by VCSEL 286 that was not absorbed by the electrons in the outer shell of the gas 246 within vapor cell 244, and an emission component, which represents the photons which are randomly emitted by the falling electrons.

Thus, upper photo detector 222 measures non-absorbed photons and emission photons to determine a total number of measured photons. The photo detect signal D1 shown in FIG. 2B generated by upper photo detector 222 represents the total number of measured photons and, thereby, has a non-absorption component and an emission component. As a result, the amplified photo detect signal AD1 shown in FIG. 2B also has both a non-absorption component and an emission component.

However, the photons that pass out of vapor cell 244 into side wall photo detector 224 are substantially only the photons that are randomly emitted by the falling electrons. Thus, side wall photo detector 224 measures substantially only emission photons to determine a total number of measured photons. The photo detect signal D2 shown in FIG. 2B generated by side wall photo detector 224 represents the total number of measured photons and, thereby, has substantially only an emission component. As a result, the amplified photo detect signal AD2 shown in FIG. 2B also has substantially only an emission component.

Differential pair circuit 230P shown in FIG. 2B subtracts the amplified photo detect signal AD2, which has substantially only an emission component, from the amplified photo detect signal AD1, which has both a non-absorption component and an emission component, to generate an output signal DS.

The emission photons are emitted randomly. As a result, the emission component of the amplified photo detect signal AD1 and the emission component of the amplified photo detect signal AD2 are, on average, equal over time. As a result, the output signal DS represents substantially only the non-absorption component.

As the electrons drop to a lower energy level and begin reabsorbing light energy, the re-absorption causes a noticeable dip in the intensity of the output signal DS. The Larmor frequency can then be determined by determining the modulated frequency that caused the intensity of the output signal DS to dip.

Thus, one of the advantages of the present invention is that side wall photo detector 224 provides an additional source of photonic information which, in turn, allows the present invention to provide an output signal DS that is more accurate than a prior art output signal that includes both a non-absorption component and an emission component. Even if the emission component of the amplified photo detect signal AD1 and the emission component of the amplified photo detect signal AD2 are not equal at a given moment, the output signal DS is still more accurate than the prior art output signal.

In addition, the increased accuracy of the output signal DS also increases the signal-to-noise ratio. Further, any systemic variations equally effect both the photo detect signals D1 and D2, and thus are subtracted out of the output signal DS by differential pair circuit 230P. Another advantage of the present invention is that having the photo detectors 222 and 224 and the circuit elements 230 integrated into the same substrate material minimizes parasitic signal attenuation from the photo detectors 222 and 224 to the amplifiers A1 and A2 within electronic circuit 230E. In addition, the use of an SOI wafer improves photo carrier signal-to-noise performance.

A further advantage of the present invention is that the efficient heat transfer provided by the diamond layers of the heat spreaders 218, 262, and 284 allows less current to be used by the heating elements 254 and 280 as well as allowing the heating elements 254 and 280 to be remotely located from vapor cell 244 and VCSEL 286, both of which require heat for conventional operation.

Less current and the remote location of the heating elements 254 and 280 allows the magnetic interference generated by current flowing through the heating elements 254 and 280 to be reduced. In addition, alkali atoms have less of a reaction with diamond than oxide or silicon when the alkali atoms bump the interior sides of vapor cell 244.

Figure 3A:
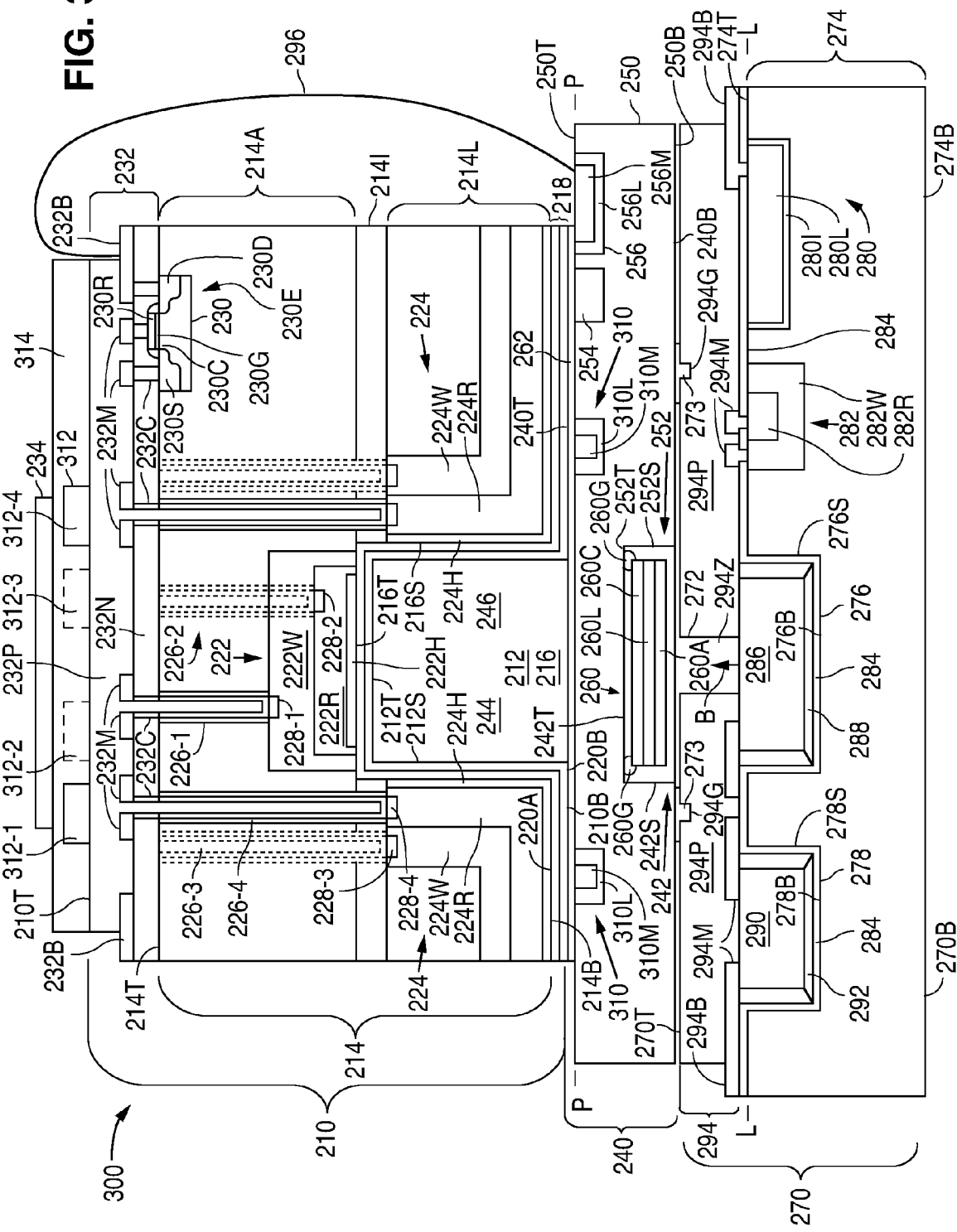
FIG. 3A is a cross-sectional view illustrating an example of a die-sized atomic magnetometer 300 in accordance with an alternate embodiment of the present invention.

FIG. 3A shows a cross-sectional view that illustrates an example of a die-sized atomic magnetometer 300 in accordance with an alternate embodiment of the present invention. Atomic magnetometer 300 is similar to atomic magnetometer 200 and, as a result, utilizes the same reference numerals to designate the elements that are common to both magnetometers.

As shown in FIG. 3A, atomic magnetometer 300 differs from atomic magnetometer 200 in that atomic magnetometer 300 includes a lower RF coil 310 which, in the present example, has a single loop. Lower RF coil 310 touches second semiconductor structure 250, and has a top surface that lies in the plane P. In the FIG. 3A example, lower RF coil 310 can be implemented with an undoped polysilicon outer layer 310L and a metallic inner region 310M, along with a pair of exposed ends that function as bond pads.

Atomic magnetometer 300 also differs from atomic magnetometer 200 in that atomic magnetometer 300 includes a number of upper RF coils 312 which each, in the present example, has a single loop. In the FIG. 3A example, four upper RF coils 312-1, 312-2, 312-3, and 312-4 are utilized. The upper RF coils 312 touch the top surface of interconnect structure 232. (Upper RF coil 312-2 and upper RF coil 312-3 are shown with dashed lines to indicate that the structures lie above and below the plane of the page.) Atomic magnetometer 300 also includes a non-conductive layer 314 that lies over the upper RF coils 312, except for a pair of ends on each coil which function as bond pads.

Figure 3B:
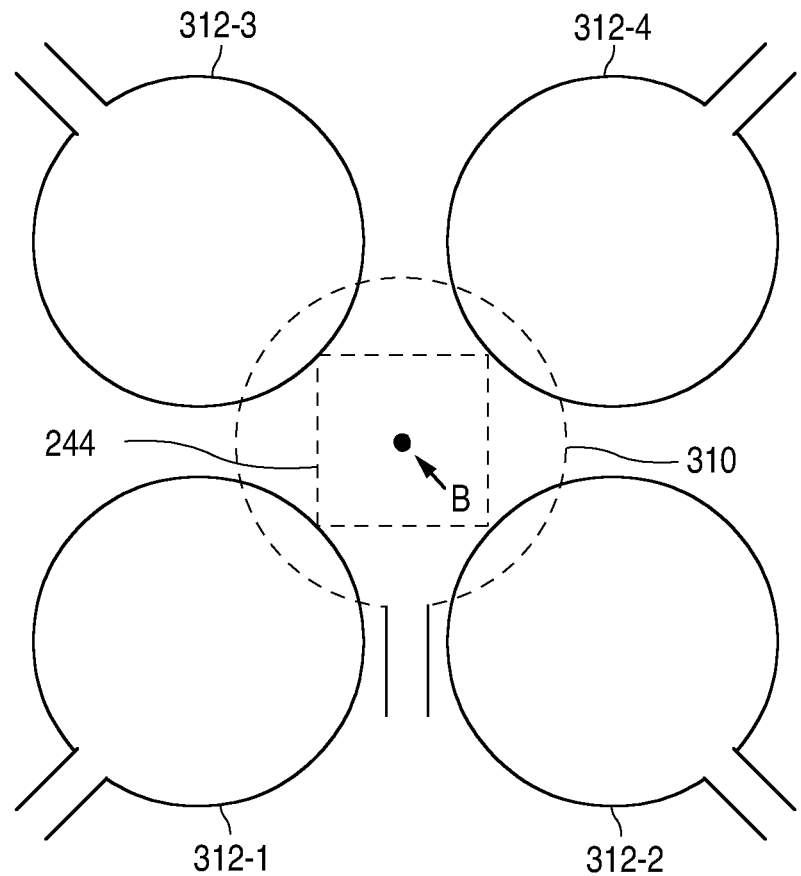
FIG. 3B is a plan view illustrating an example of the RF coils in accordance with the present invention.

FIG. 3B shows a plan view that illustrates an example of the RF coils in accordance with the present invention. As shown in FIG. 3B, lower RF coil 310 substantially surrounds the longitudinal axis of a beam of laser light B that is output by VCSEL 286, while none of the upper RF coils 312-1, 312-2, 312-3, and 312-4 surround any portion of the longitudinal axis of laser light beam B. Each of the loops of the upper RF coils 312-1, 312-2, 312-3, and 312-4 lies in a plane that lies above the plane that includes lower RF coil 310.

Figure 3C:
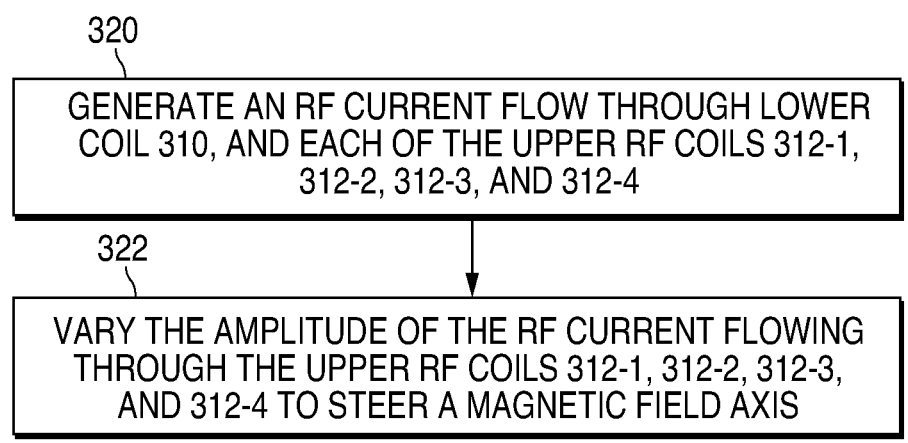
FIG. 3C is a flow chart illustrating an example of a method of operating atomic magnetometer 300 in accordance with the present invention.

FIG. 3C shows a flow chart that illustrates an example of a method of operating atomic magnetometer 300 in accordance with the present invention. As shown in FIG. 3B, the method begins in 320 by generating an RF current flow through lower RF coil 310, and each of the upper RF coils 312-1, 312-2, 312-3, and 312-4.

After this, the method moves to 322 where the amplitude of the RF current flowing through the upper RF coils 312-1, 312-2, 312-3, and 312-4 is varied to steer a magnetic field axis of a magnetic field that results from the RF current flow through lower RF coil 310 and the upper RF coils 312-1, 312-2, 312-3, and 312-4. The magnetic field axis is steered to be parallel with the longitudinal axis of a laser light beam B generated by VCSEL 286 (which passes through optics package 260 and vapor cell 244).

As a result, the current through the four upper RF coils 312-1, 312-2, 312-3, and 312-4 can be individually varied to steer the axis of the overall magnetic field that results from current flowing through lower RF coil 310 and the currents flowing through the four upper RF coils 312-1, 312-2, 312-3, and 312-4.

Thus, one of the advantages of the present invention is that atomic magnetometer 300 allows the axis of the overall magnetic field to be aligned with the axis of the laser light output by VCSEL 286. Atomic magnetometer 300 otherwise operates in the same manner as atomic magnetometer 200, except that the $M_X$ technique is used to identify the Larmor frequency rather than the BB technique utilized by atomic magnetometer 200, i.e., the RF frequency applied to the lower and upper RF coils 310 and 312 is swept across a range of frequencies. Another advantage of atomic magnetometer 300 is that atomic magnetometer 300 can be implemented to operate using either the $M_X$ technique or the BB technique.

Figure 4:
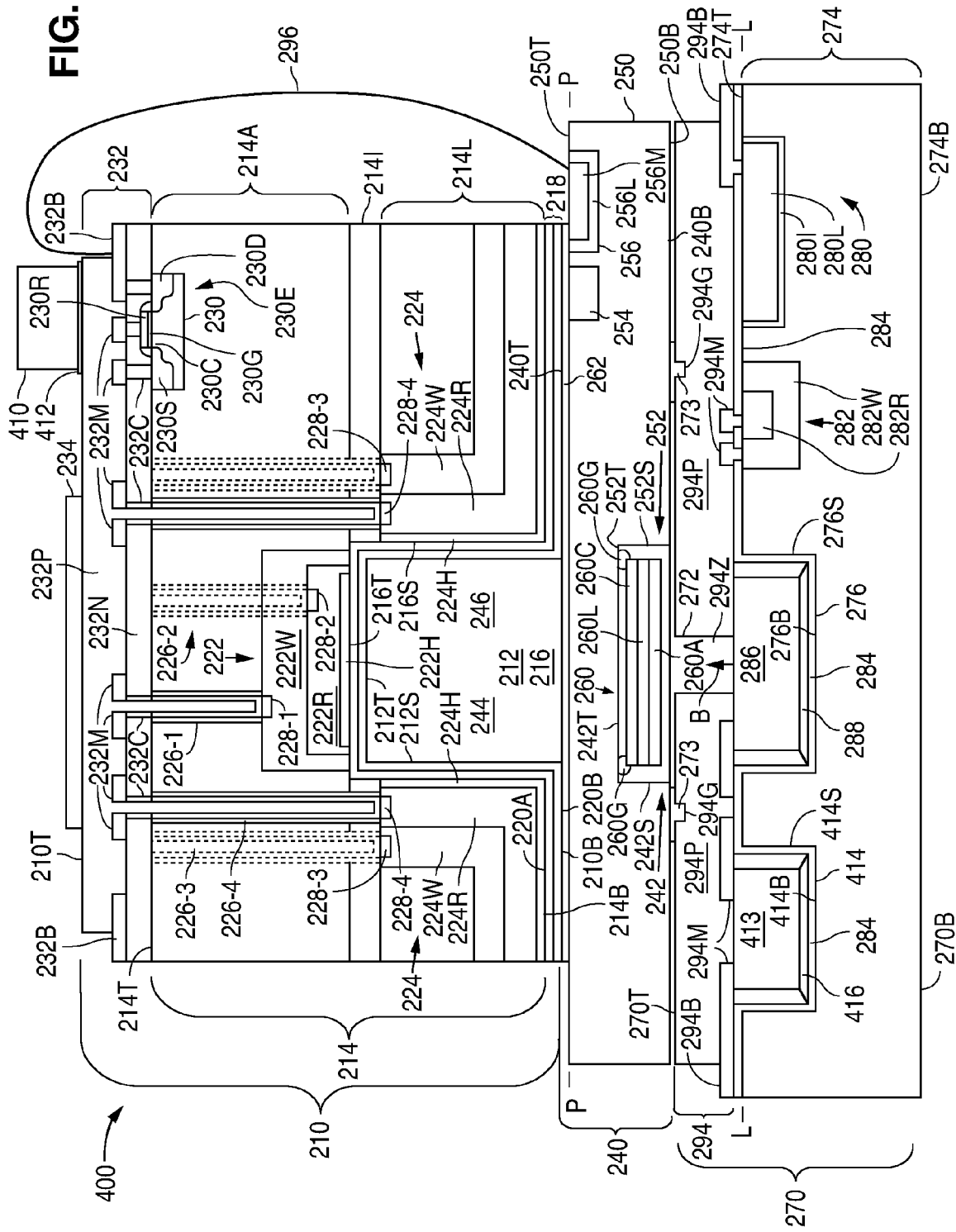
FIG. 4 is a cross-sectional view illustrating an example of a die-sized atomic magnetometer 400 in accordance with an alternate embodiment of the present invention.

FIG. 4 shows a cross-sectional view that illustrates an example of a die-sized atomic magnetometer 400 in accordance with an alternate embodiment of the present invention. Atomic magnetometer 400 is similar to atomic magnetometer 200 and, as a result, utilizes the same reference numerals to designate the elements that are common to both magnetometers.

As shown in FIG. 4, atomic magnetometer 400 is identical to atomic magnetometer 200, except that atomic magnetometer 400 also includes a an upper ferrite block 410 that is attached to the top surface of interconnect structure 232 by an adhesive layer 412. Adhesive layer 412 can be implemented with a conventional glue or die attach adhesive.

As further shown in FIG. 4, atomic magnetometer 400 additionally includes a lower ferrite block 413, while the third semiconductor structure 274 of atomic magnetometer 400 includes a fifth semiconductor cavity 414 that extends into third semiconductor structure 274 from the top surface 274T of third semiconductor structure 274. Fifth semiconductor cavity 414 has a bottom surface 414B and a side wall surface 414S. Lower ferrite block 413, in turn, is attached to the bottom surface 414B of fifth semiconductor cavity 414 by an adhesive layer 416. Adhesive layer 416 can be implemented with a conventional glue or die attach adhesive.

Upper ferrite block 410 and lower ferrite block 413 are positioned to establish a magnetic field that lies approximately 45° off of the axis of the laser beam output from VCSEL 286, which provides maximum sensitivity. Thus, one of the advantages of atomic magnetometer 400 is that atomic magnetometer 400 provides the maximum sensitivity.

Figure 5A:
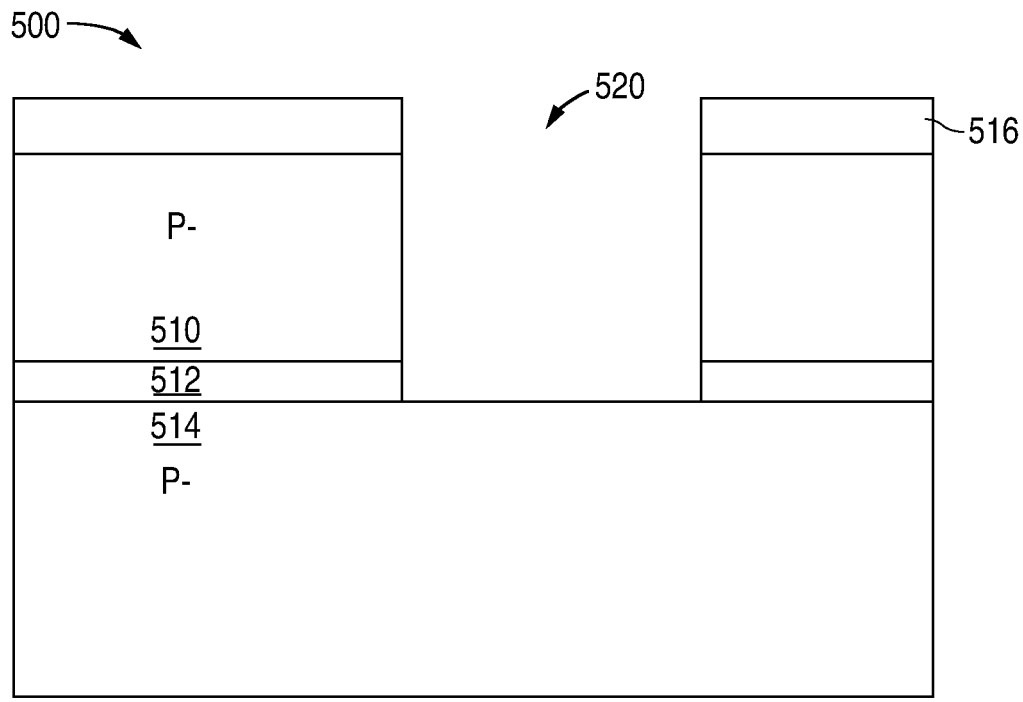
FIGS. 5A-5U are a series of cross-sectional views illustrating an example of a method of forming a first wafer in accordance with the present invention.
Figure 5B:
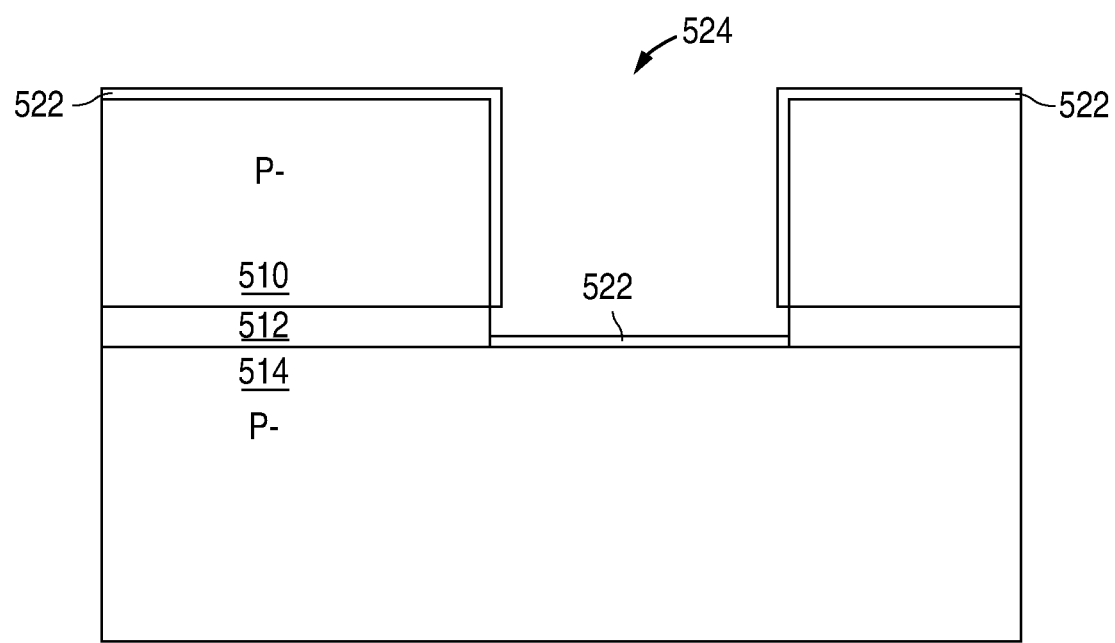
Figure 5C:
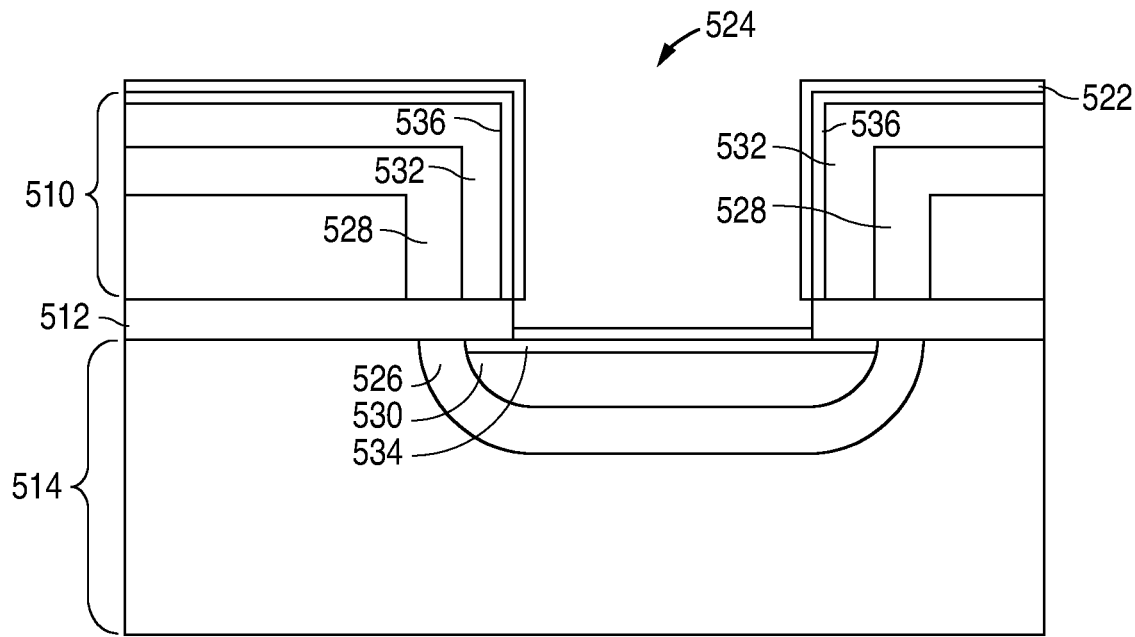
Figure 5D:
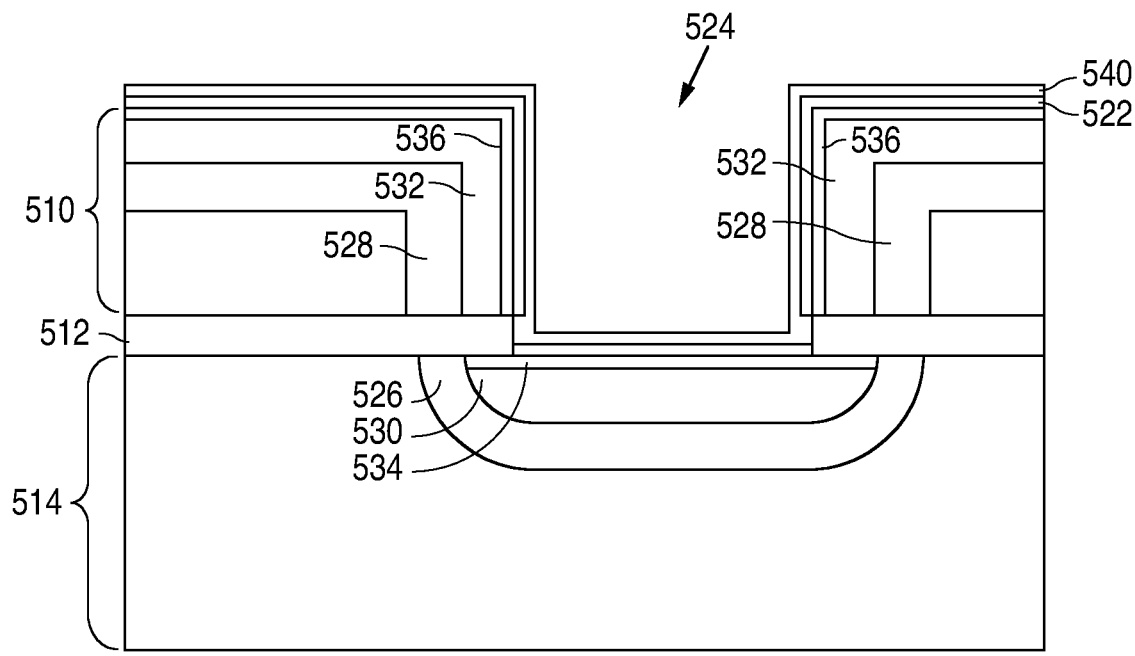
Figure 5E:
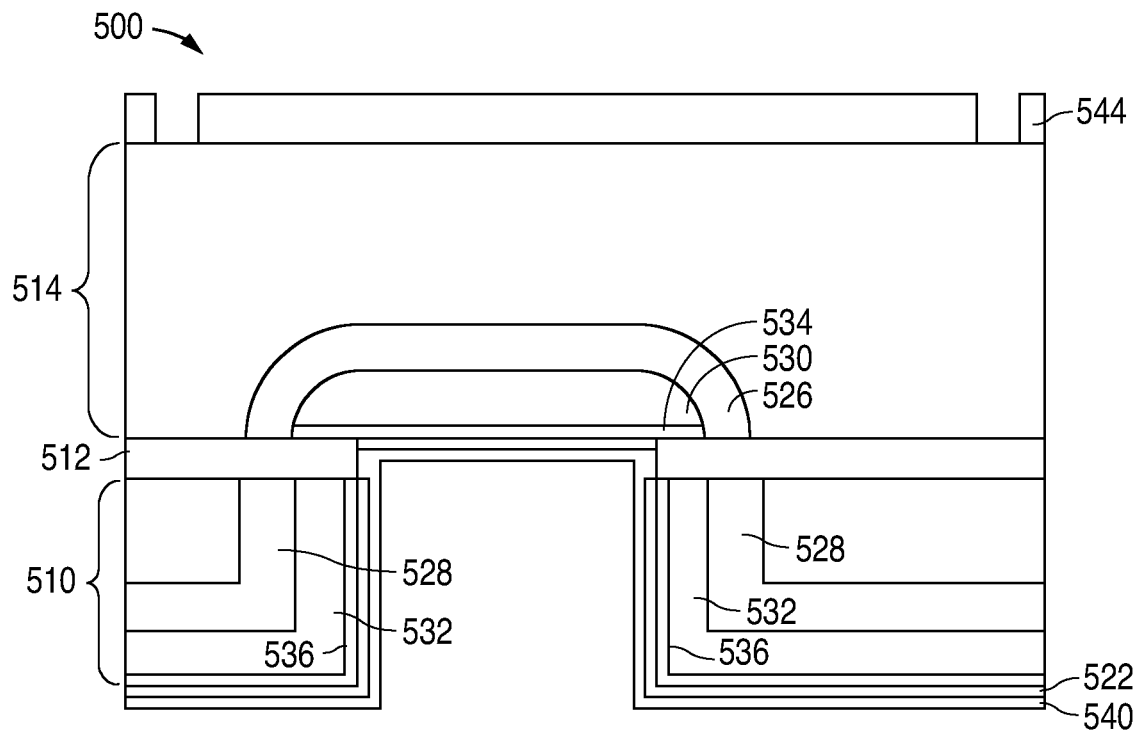
Figure 5F:
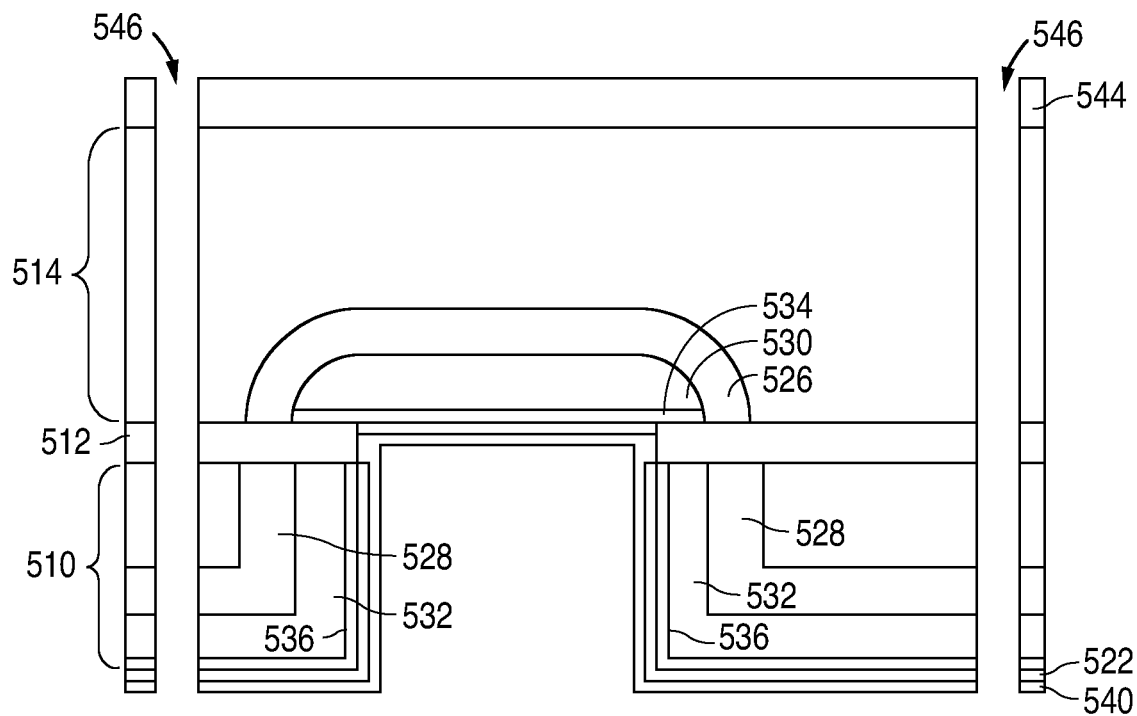
Figure 5G:
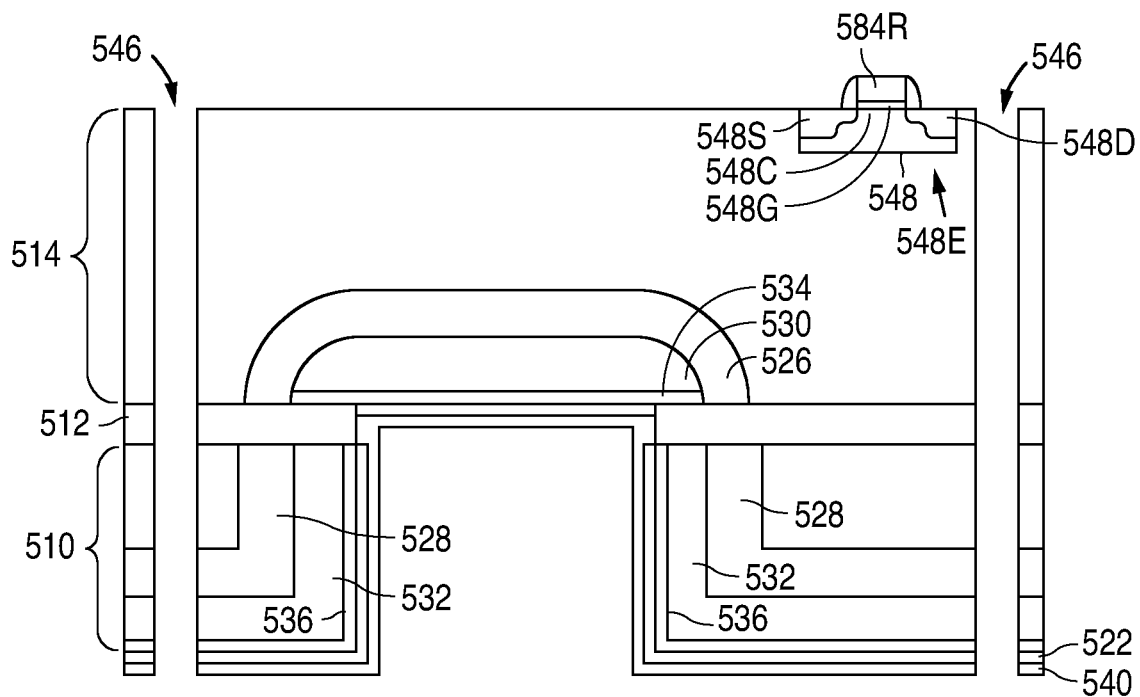
Figure 5H:
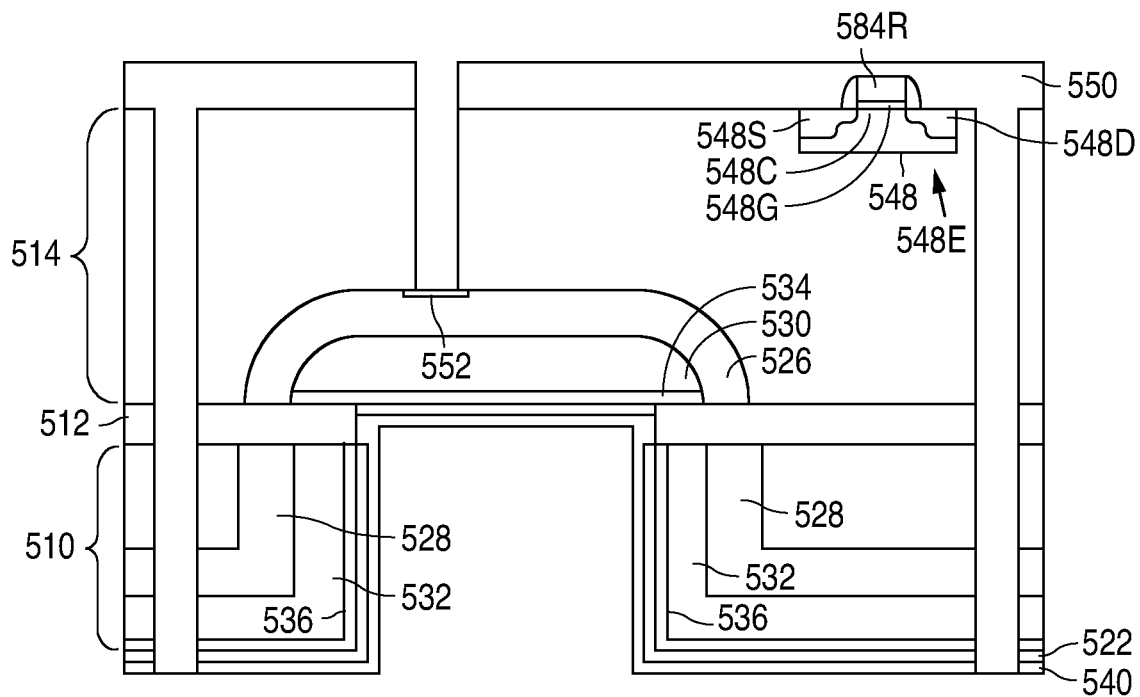
Figure 5I:
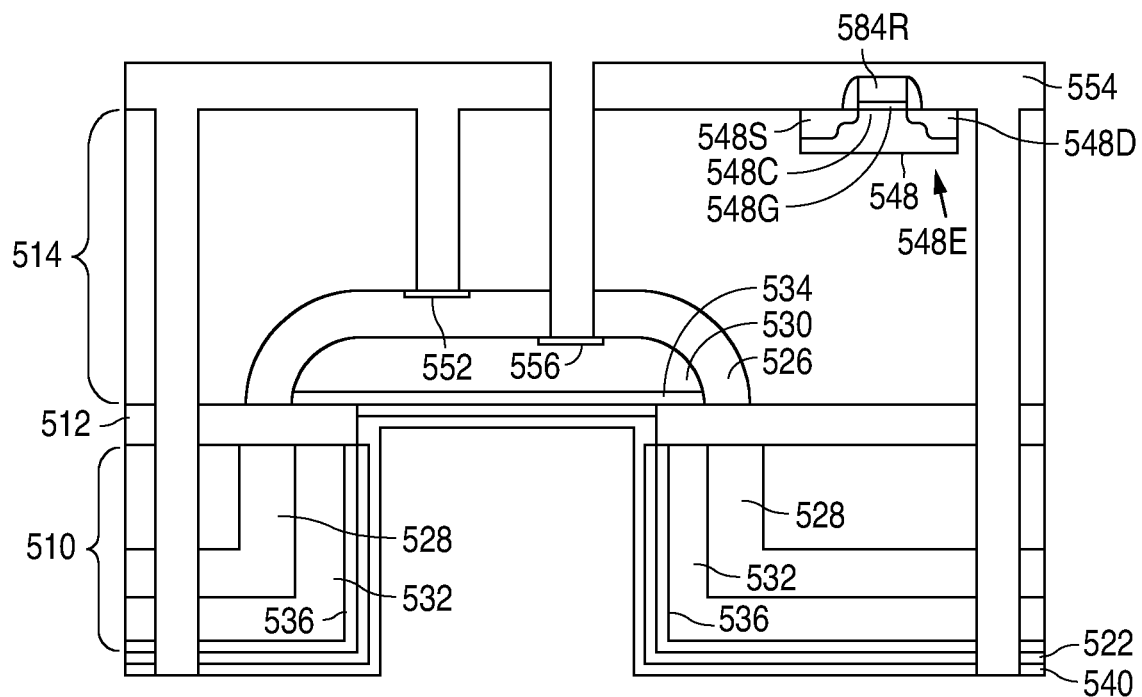
Figure 5J:
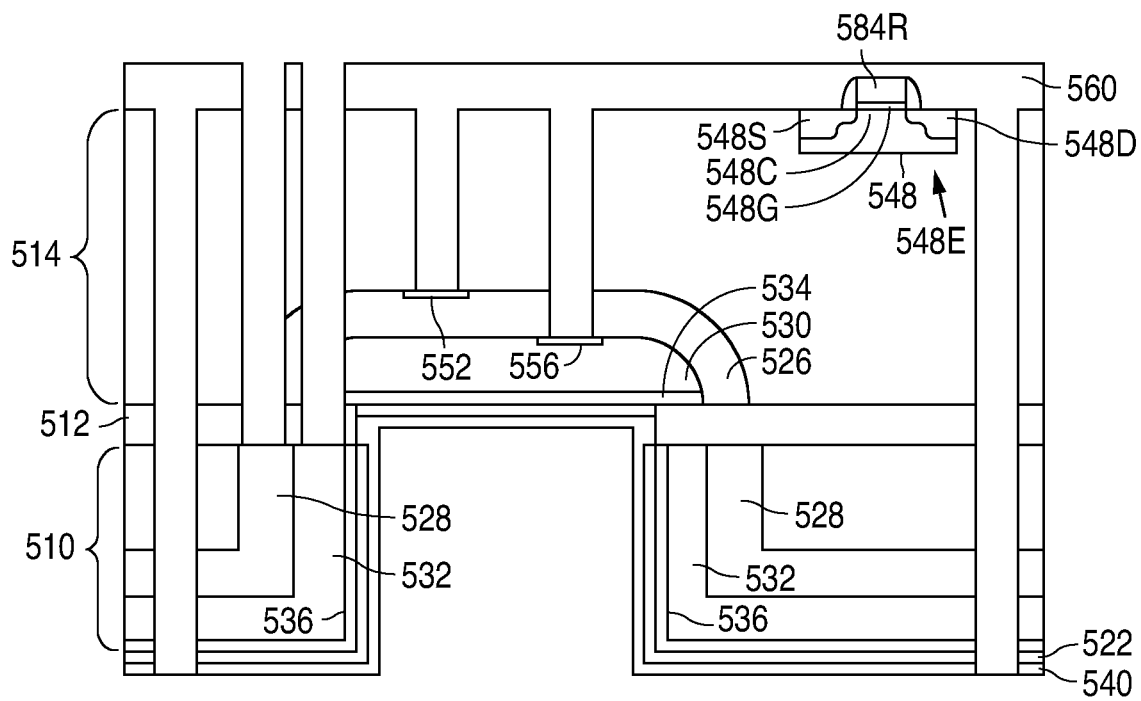
Figure 5K:
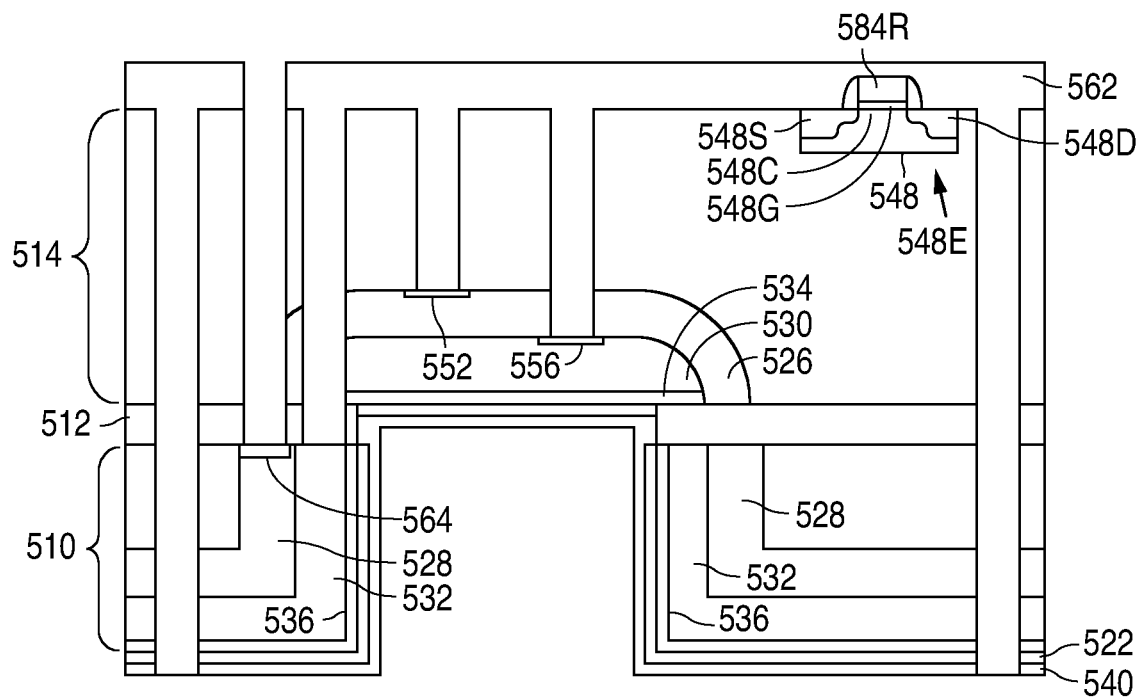
Figure 5L:
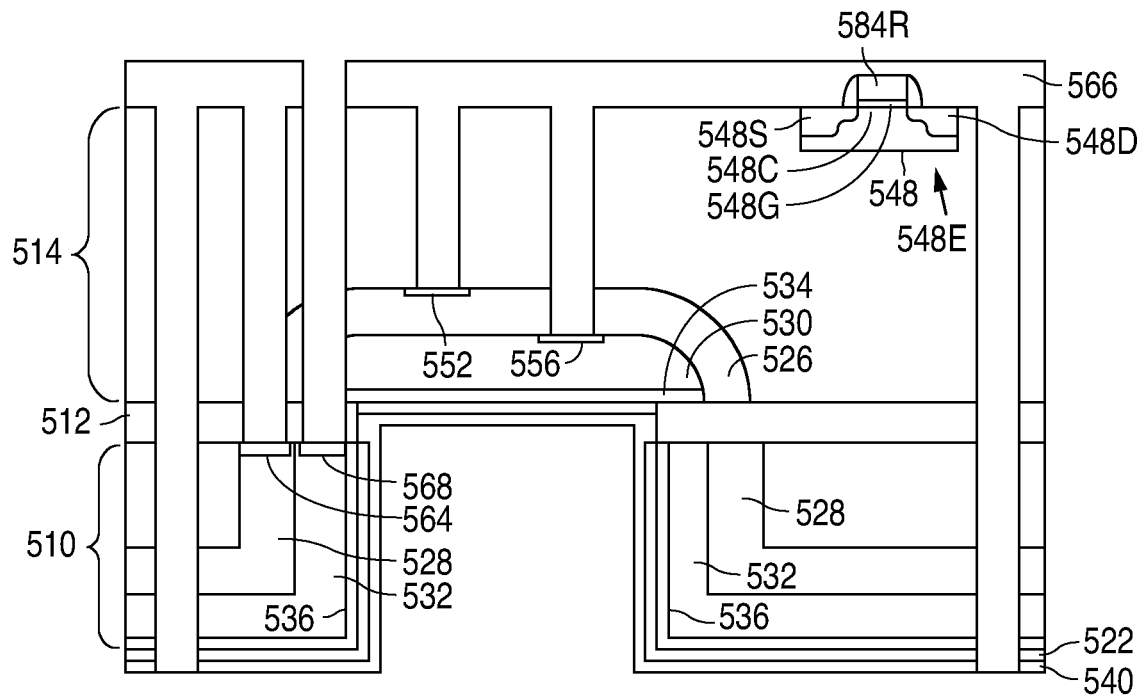
Figure 5M:
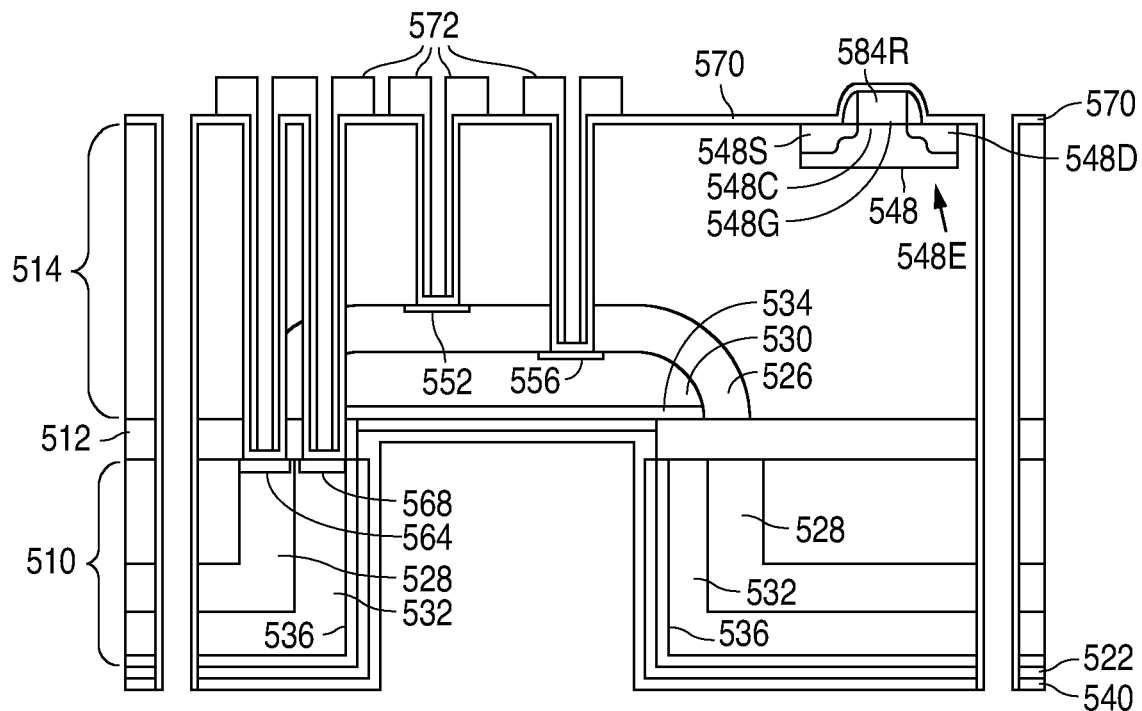
Figure 5N:
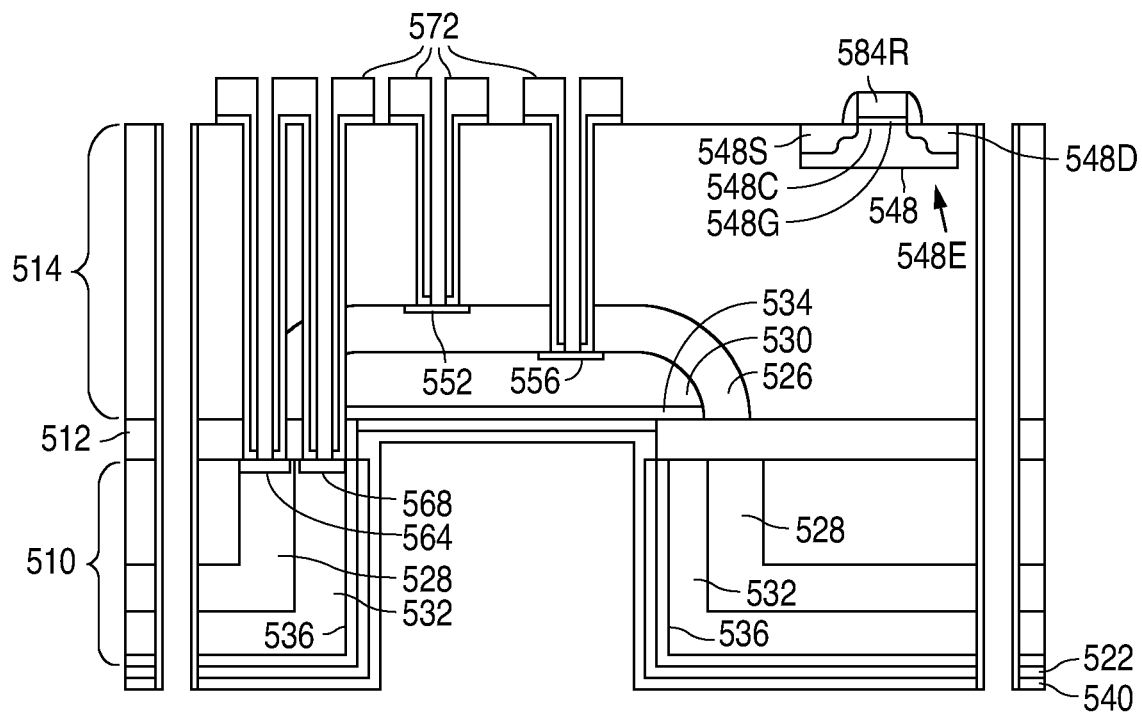
Figure 5O:
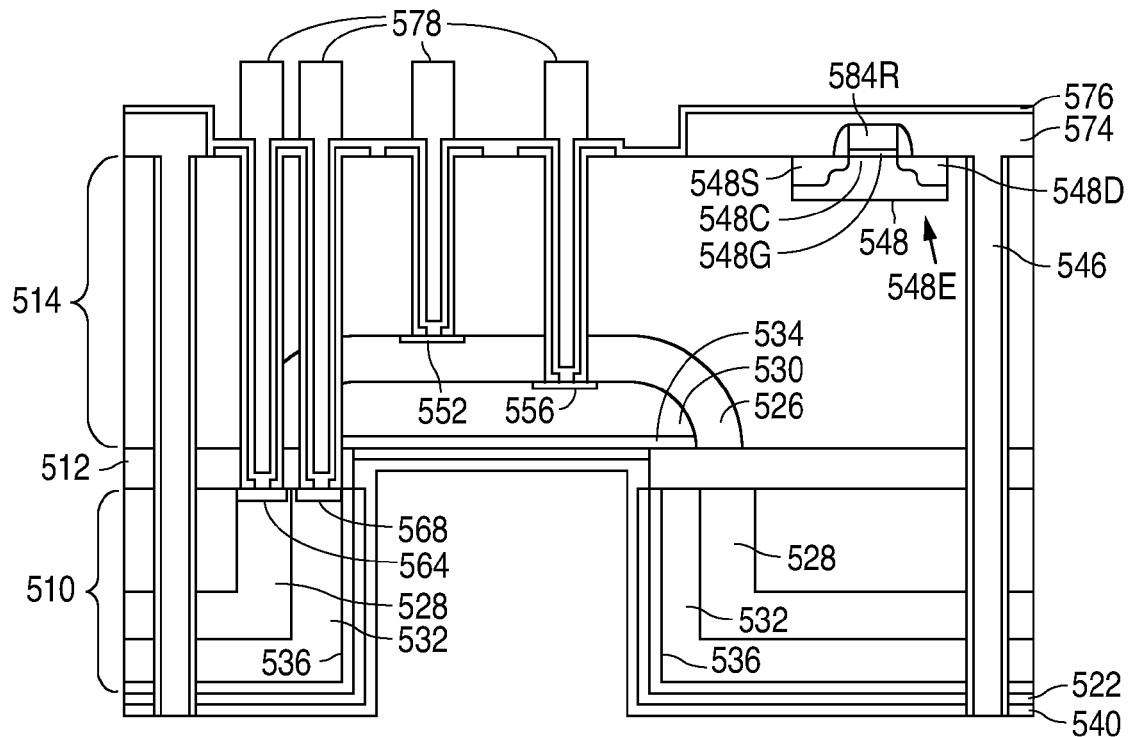
Figure 5P:
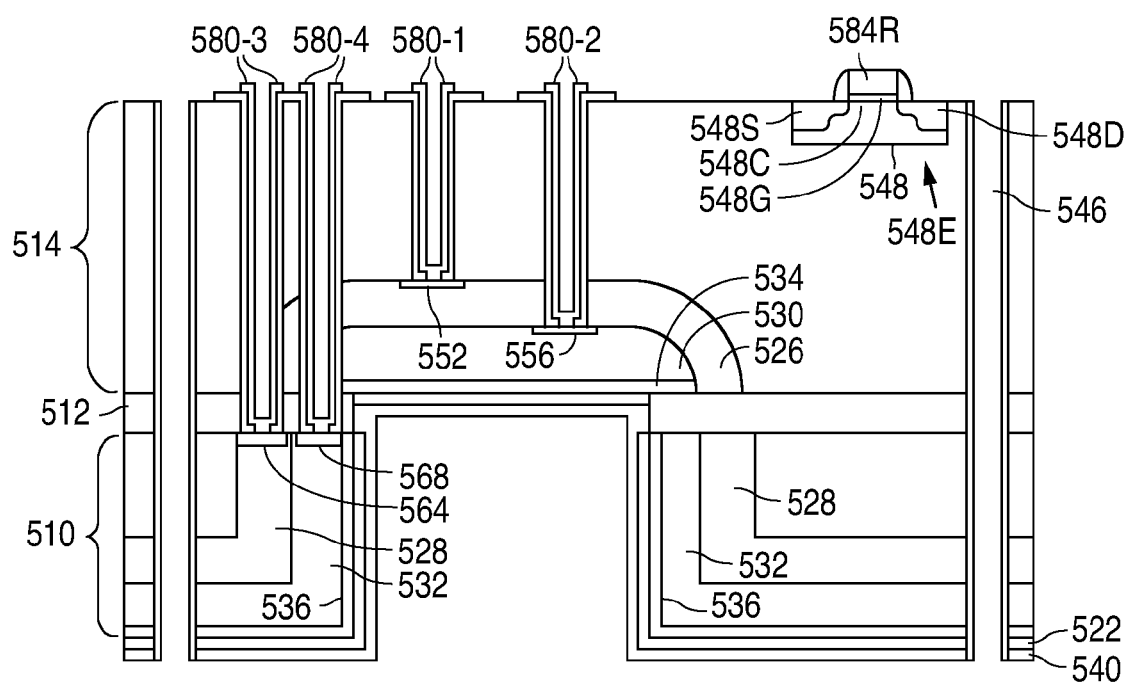
Figure 5Q:
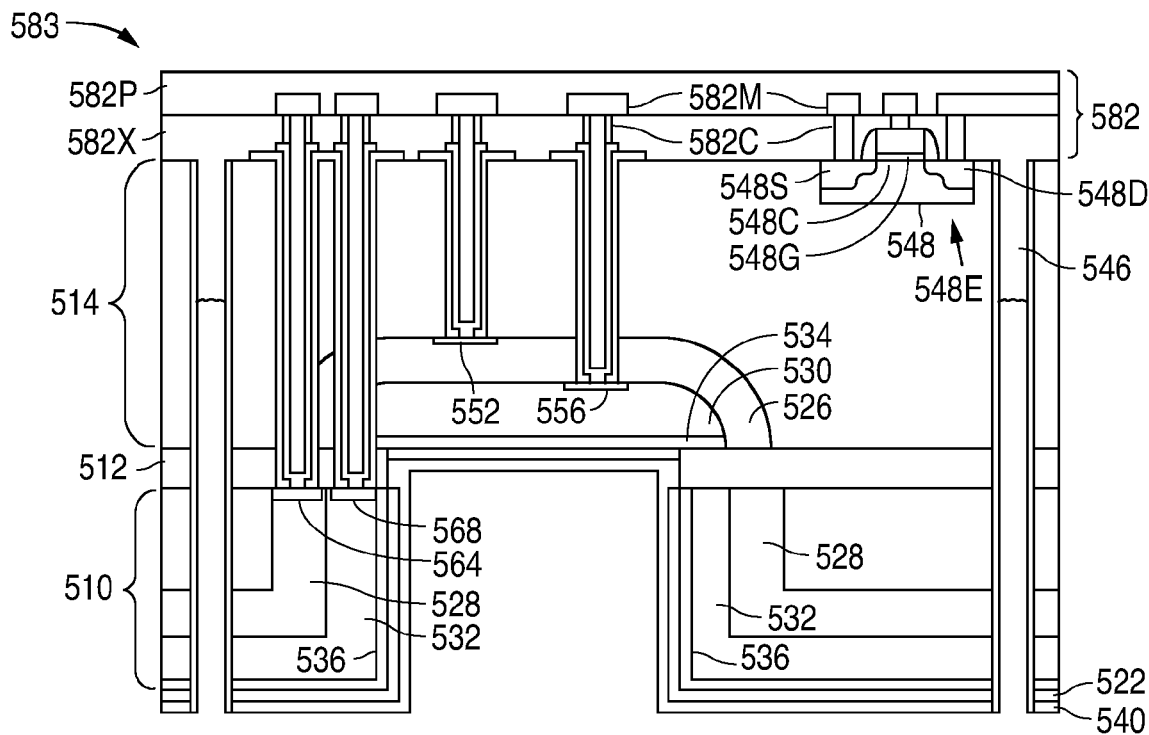
Figure 5R:
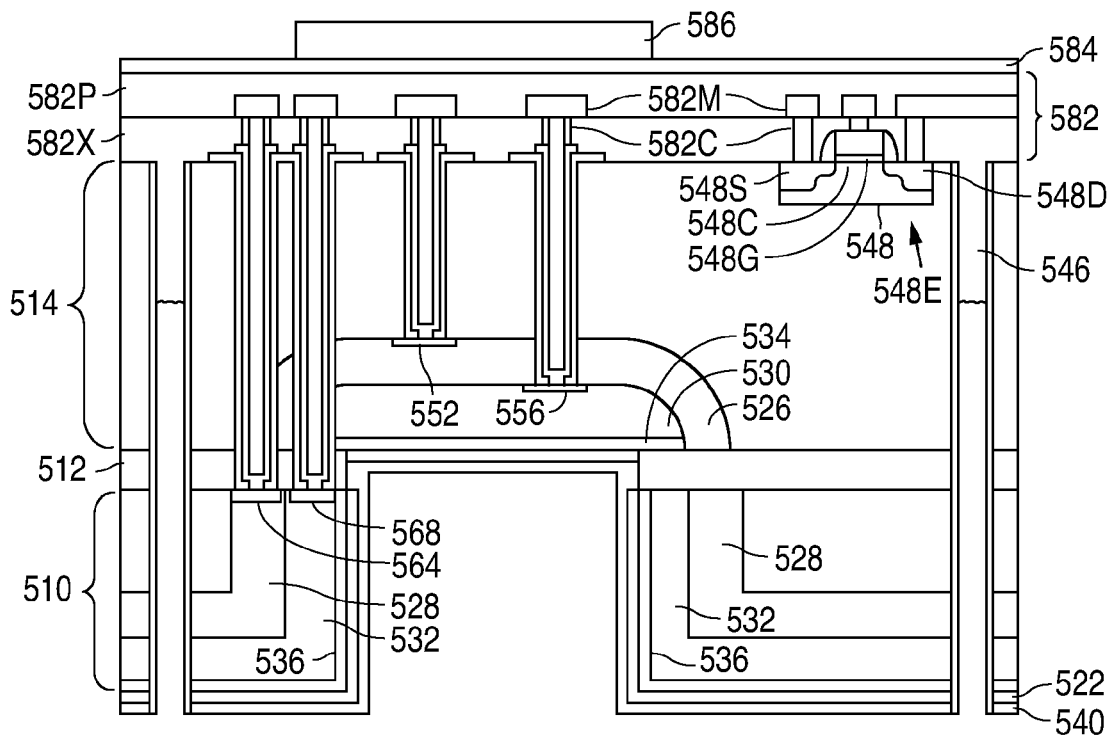
Figure 5S:
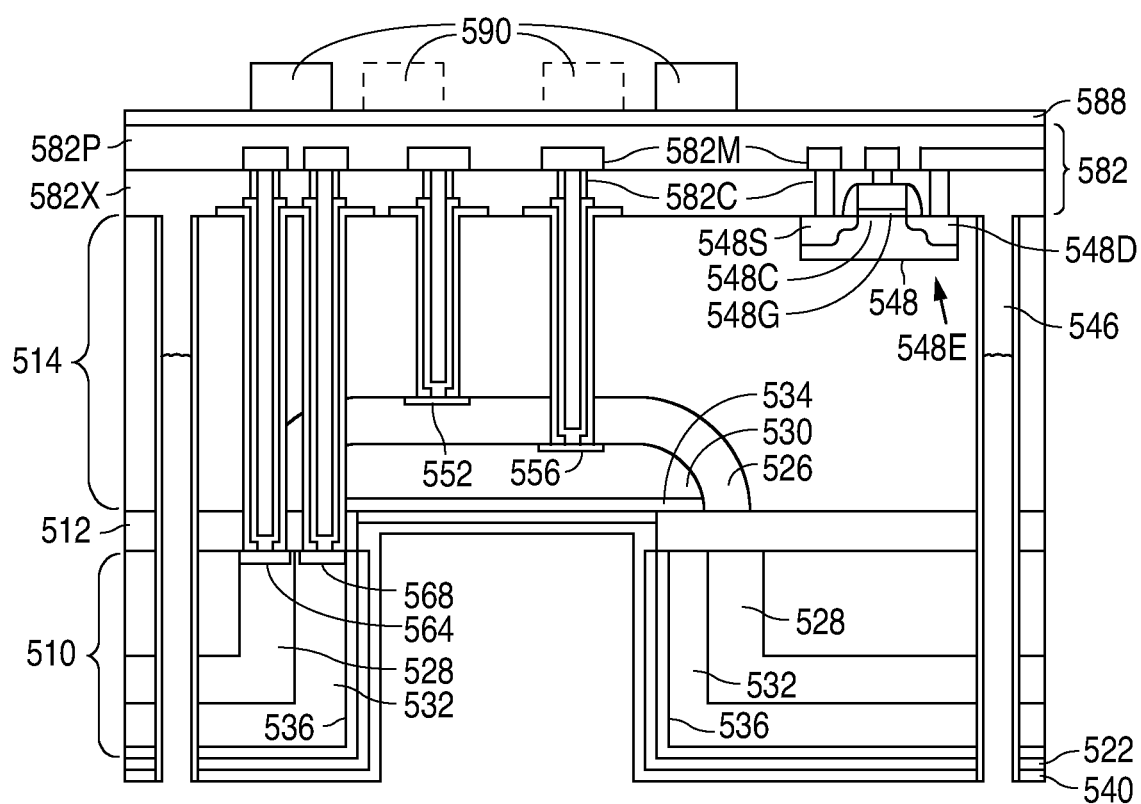
Figure 5T:
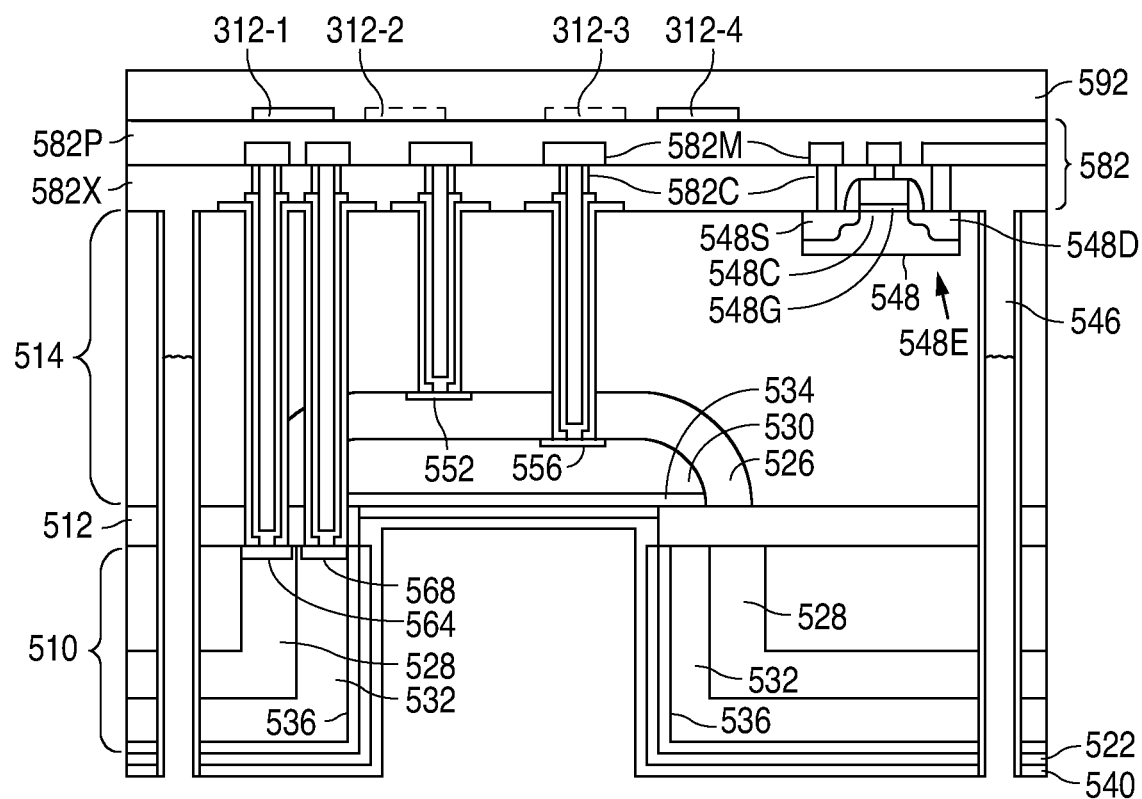
Figure 5U:
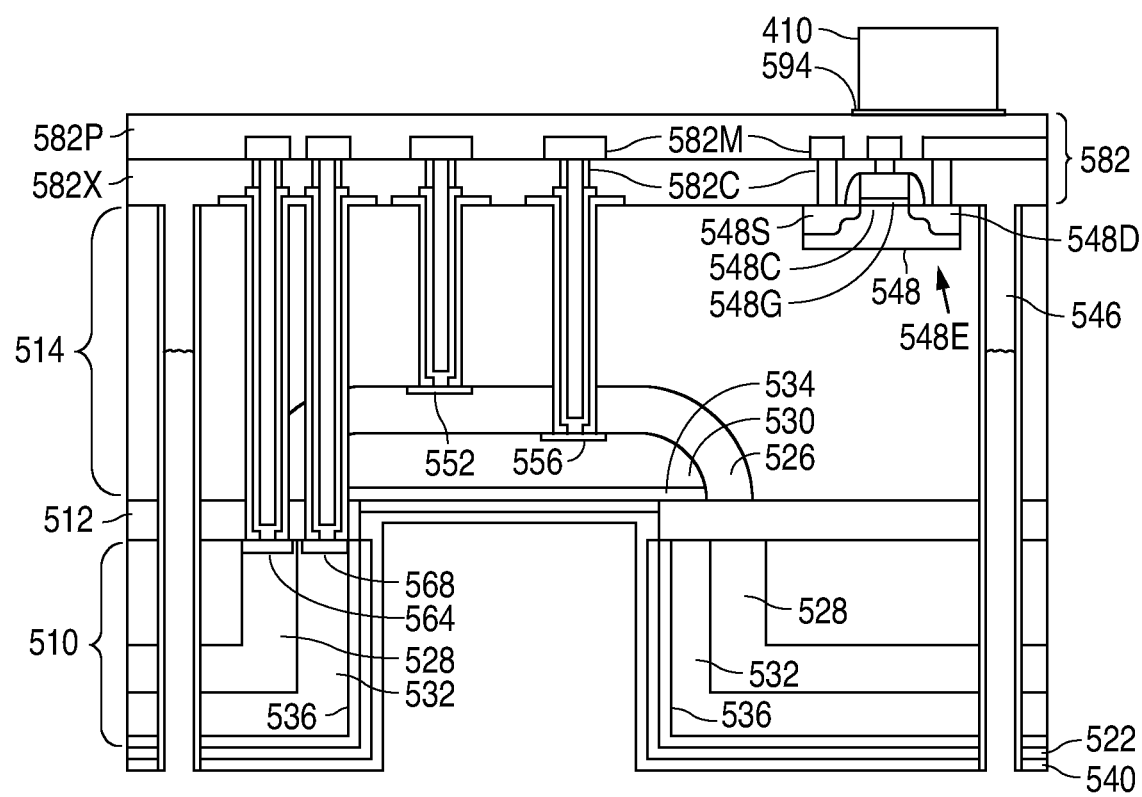

FIGS. 5A-5U show a series of cross-sectional views that illustrate an example of a method of forming a first wafer in accordance with the present invention. As shown in FIG. 5A, the method utilizes a conventionally formed silicon-on-insulator (SOI) wafer 500 that includes a p-type single-crystal silicon bulk 510, an insulator 512 that touches p-type bulk 510, and a p-type single-crystal silicon active region 514 that touches insulator 512. In the present example, SOI wafer 500 is approximately 1 mm thick and polished on both sides, while active region 514 has a thickness in the range of 10-100 μm. The method includes both front-side and back-side processing which can be performed in either order.

As further shown in FIG. 5A, the method begins with the back-side processing by inverting SOI wafer 500, thinning the p-type bulk 510 as needed, and then forming a mask 516 on p-type bulk 510 in a conventional manner. After mask 516 has been formed, the exposed regions of p-type bulk 510 are etched until the surface of insulator 512 is exposed. In the present example, the exposed regions of insulator 512 are then etched to expose p-type active region 514 and form a semiconductor cavity 520. Mask 516 is then removed in a conventional manner.

Following this, as shown in FIG. 5B, a layer of oxide is grown on the exposed regions of p-type bulk 510. After this, the layer of oxide is removed using a conventional dip, and then re-grown to form a thin oxide layer 522 approximately 500Å thick. Oxide layer 522 lines cavity 520 to form a lined cavity 524.

Next, as shown in FIG. 5C, a p-type dopant, such as boron, is implanted without masking through oxide layer 522 and driven in to form a p− well 526. P− well 526 has a dopant concentration that is greater than the dopant concentration of p-type active region 514. Once p− well 526 has been formed, a p-type dopant is then angle implanted in a conventional manner without masking and driven in to form a p− side-wall well 528. P-side-wall well 528 has a dopant concentration that is greater than the dopant concentration of p-type bulk 510.

After p− side-wall well 528 has been formed, an n-type material, such as phosphorous, is implanted with a lower implant energy without masking through oxide layer 522 and driven in to form an n-type region 530 in p− well 526. Following this, an n-type dopant is angle implanted with a lower implant energy in a conventional manner without masking and driven in to form an n-type side-wall region 532 within p− side-wall well 528.

In the present example, a p-type dopant is next implanted with a lower implant energy without masking through oxide layer 522 and driven in to form a thin p+ layer 534. After this, a p-type dopant is angle implanted with a lower implant energy in a conventional manner without masking and driven in to form a thin p+ side-wall layer 536.

The above dopant steps are illustrated without lithography, which can optionally be utilized, for example, to block the formation of p-type and n-type materials into the bottom surface of p-type bulk 510. P− well 526, n-type region 530, and thin p+ layer 534 form upper photo detector 222, while p− well 528, n-type region 532, and thin p+ side-wall layer 536 form side-wall photo detector 224.

Following this, as shown in FIG. 5D, a diamond layer 540 is formed with conventional chemical vapor deposition on oxide layer 522 to line cavity 524 and form a lined cavity 542. Diamond layer 540 is highly thermally conductive (e.g., 5-10× more thermally conductive than copper). In the present example, oxide layer 522 and diamond layer 540 form heat spreader 218.

As shown in FIG. 5E, the method continues with the front-side processing by inverting SOI wafer 500, and then forming a mask 544 on the top side of p-type active region 514 in a conventional manner. Following this, as shown in FIG. 5F, the exposed regions are etched until a number of through-the-wafer openings 546 have been formed. Once the through-the-wafer openings 546 have been formed, mask 544 is removed in a conventional manner. (The through-the-wafer openings 546 expose bond pads after a subsequent dicing process.)

Next, as shown in FIG. 5G, a number of circuit elements 548 are formed in and on the top surface of p− active region 514 in a conventional manner. The circuit elements 548 include transistors, resistors, capacitors, diodes, and similar circuit devices. (For simplicity, only one NMOS transistor 548, which has an n-type source 548S and an n-type drain 548D spaced apart by a p-type channel 548C, a gate oxide layer 548G that touches the top surface of p− active region 514 over channel 548C, and a gate 548R that touches oxide layer 548G over channel 548C, is illustrated.)

When electrically connected together, the circuit elements 548 form an electronic circuit 548E that detects and amplifies the signals output by upper photo detector 222 and side wall photo detector 224. In addition, electronic circuit 548E can also compare the amplified signal from side wall photo detector 224 to the amplified signal from upper photo detector 222, such as by using the amplified signal from side wall photo detector 224 and the amplified signal from upper photo detector 222 as the inputs to a conventional differential pair circuit.

After the circuit elements 548 have been formed, as shown in FIG. 5H, a mask 550 is formed on the top surface of p− active region 514 in a conventional manner. Following this, the exposed regions of p– active region 514 are etched away to form an opening that exposes p– well 526. A p-type material is then implanted through the opening to form a p+ contact region 552 in p– well 526. Mask 550 is then removed in a conventional manner.

After mask 550 has been removed, as shown in FIG. 5I, a mask 554 is formed on the top surface of p– active region 514. Following this, the exposed regions of p– active region 514 are etched away to form an opening that exposes n-type region 530. An n-type material is then implanted through the opening to form an n+ contact region 556 in n-type region 530. Mask 554 is then removed.

After mask 554 has been removed, as shown in FIG. 5J, a mask 560 is formed on the top surface of p– active region 514. Following this, the exposed regions of p– active region 514 and insulator 512 are etched away to form an opening that exposes p– side-wall well 528 and an opening that exposes n-type side-wall region 532. Mask 560 is then removed.

After mask 560 has been removed, as shown in FIG. 5K, a mask 562 is formed on the top surface of p– active region 514 with an opening that exposes p– side-wall well 528. A p-type material is then implanted through the opening to form a p+ contact region 564 in p– side-wall well 528. Mask 562 is then removed.

After mask 562 has been removed, as shown in FIG. 5L, a mask 566 is formed on the top surface of p– active region 514 with an opening that exposes n-type side-wall region 532. An n-type material is then implanted through the opening to form an n+ contact region 568 in n-type side-wall region 532. Mask 566 is then removed to expose p+ contact region 552, n+ contact region 556, p+ contact region 564, and n+ contact region 568. Although the present example illustrates p+ contact region 552, n+ contact region 556, p+ contact region 564, and n+ contact region 568 each being exposed by a single opening, multiple openings can be used to expose each of these highly doped regions.

Following the removal of mask 566, as shown in FIG. 5M, an oxide layer 570 is formed on the top surface of p– active region 514 to line the openings that expose p+ contact region 552, n+ contact region 556, p+ contact region 564, and n+ contact region 568. Following this, a mask 572 is formed and patterned on oxide layer 570 to expose the regions of oxide layer 570 that lie over p+ contact region 552, n+ contact region 556, p+ contact region 564, and n+ contact region 568. Mask 572 also exposes the regions of oxide layer 570 that lie over the circuit elements 548.

As shown in FIG. 5N, after mask 572 has been formed, the exposed regions of oxide layer 570 are then etched to expose p+ contact region 552, n+ contact region 556, p+ contact region 564, and n+ contact region 568. In addition, the circuit elements 548 are also exposed. Mask 572 is then removed.

After this, as shown in FIG. 5O, a photoresist layer 574 is deposited and patterned to cover the circuit elements 548 and the through-the-wafer openings 546, followed by the conventional deposition of a metal contact layer 576. Metal contact layer 576, which can include tungsten, lines the openings and makes electrical connections to p+ contact region 552, n+ contact region 556, p+ contact region 564, and n+ contact region 568. After metal contact layer 576 has been formed, a mask 578 is formed on metal contact layer 576.

As shown in FIG. 5P, after mask 578 has been formed, the exposed regions of metal contact layer 576 are etched to form a first metal contact structure 580-1 that makes an electrical connection with p+ contact region 552, and a second metal contact structure 580-2 that makes an electrical connection with n+ contact region 556. The etch also forms a third metal contact structure 580-3 that makes an electrical connection with p+ contact region 564, and a fourth metal contact structure 580-4 that makes an electrical connection with n+ contact region 568. Following the etch, mask 578 is conventionally removed, followed by the conventional removal of photoresist layer 574.

Oxide layer 570 and first metal contact structure 580-1 form first photo detector contact structure 226-1, while oxide layer 570 and second metal contact structure 580-2 form second photo detector contact structure 226-2, oxide layer 570 and third metal contact structure 580-3 form third photo detector contact structure 226-3, and oxide layer 570 and fourth metal contact structure 580-4 form fourth photo detector contact structure 226-4.

As shown in FIG. 5Q, following the removal of photoresist layer 574, an interconnect structure 582 is conventionally formed on the top surface of p– active region 514 to electrically connect first metal contact structure 580-1, second metal contact structure 580-2, third metal contact structure 580-3, and fourth metal contact structure 580-4 to electronic circuit 548E, and form a first fabricated wafer 583.

Interconnect structure 582 can be conventionally formed by depositing an oxide layer 582X, followed by a mask and etch step to form openings that expose first metal contact structure 580-1, second metal contact structure 580-2, third metal contact structure 580-3, fourth metal contact structure 580-4, and the conductive contacts of electronic circuit 548E. Following this, a metal layer is deposited, and then planarized to remove the metal layer from the top surface of oxide layer 582X and form contacts 582C in the openings.

After the metal contacts 582C have been formed, a metal layer is deposited and then masked and etched to form a number of metal-1 traces 582M. Following this, a passivation layer 582P is formed to touch oxide layer 582X and the metal-1 traces 582M. Regions of passivation layer 582P, which can be implemented with a layer of oxide and an overlying layer of nitride, are then removed to expose the bond pad regions of the metal-1 traces 582M.

As shown in FIG. 5R, optional mirror 234 can be formed by depositing a layer of metal 584, such as aluminum, on the top surface of interconnect structure 582, followed by the formation of a mask 586. Once mask 586 has been formed, the exposed regions of metal layer 584 are etched and removed. Mask 586 is then removed to form mirror 234.

As shown in FIG. 5S, the upper RF coils 312 of atomic magnetometer 300 can similarly be formed, by depositing a layer of metal 588, such as aluminum, on the top surface of interconnect structure 582, followed by the formation of a mask 590. (The dashed portions of mask 590 indicate that portions of the mask lie above and below the plane of the page.)

Once mask 590 has been formed, as shown in FIG. 5T, the exposed regions of metal layer 588 are etched and removed. Mask 590 is then removed to form the four upper RF coils 312. Following this, a passivation layer 592 is formed to touch passivation layer 582P and the four upper RF coils 312. Regions of passivation layer 592, which can be implemented with a layer of oxide and an overlying layer of nitride, are then removed to expose the bond pad regions of the upper RF coils 312.

Alternately, the upper RF coils 312 can be electrically connected to the metal-1 traces 582M by forming openings in passivation layer 582P to expose regions of the metal-1 traces 582M before metal layer 588 is deposited. In addition, the upper RF coils 312 can alternately be formed by way of a conventional electroplating process, which includes deposition of a seed layer, followed by the formation of a plating mold with four coil openings and electroplating.

As shown in FIG. 5U, upper ferrite block 410 of atomic magnetometer 400 can be attached by applying an adhesive layer 594 to the top surface of interconnect structure 582 with a conventional pick-and-place machine, and then using a conventional pick-and-place machine to place ferrite block 410 onto adhesive layer 594. Adhesive layer 594 can be implemented with a conventional glue or die attach adhesive.

Figure 6A:
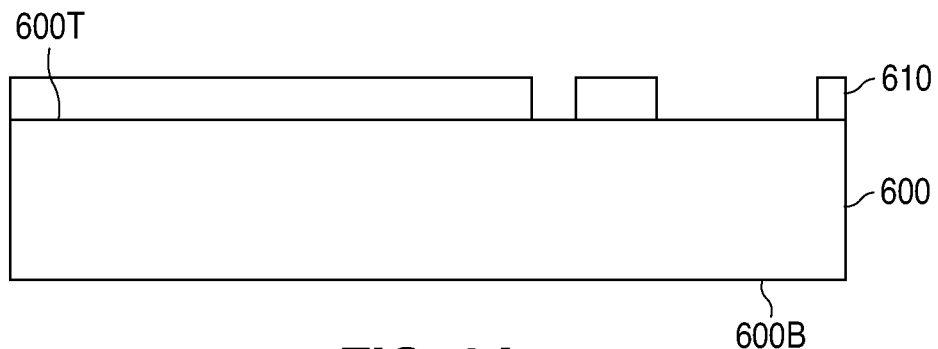
FIGS. 6A-6I are a series of cross-sectional views illustrating an example of a method of forming second wafer in accordance with the present invention.

FIGS. 6A-6I show a series of cross-sectional views that illustrate an example of a method of forming a second wafer in accordance with the present invention. As shown in FIG. 6A, the method utilizes a conventionally formed borosilicate glass wafer 600 that has a top surface 600T and a bottom surface 600B. In the present example, wafer 600 is approximately 700 µm thick, and polished on both sides. The method includes both front-side and back-side processing which can be performed in either order.

Figure 6B:
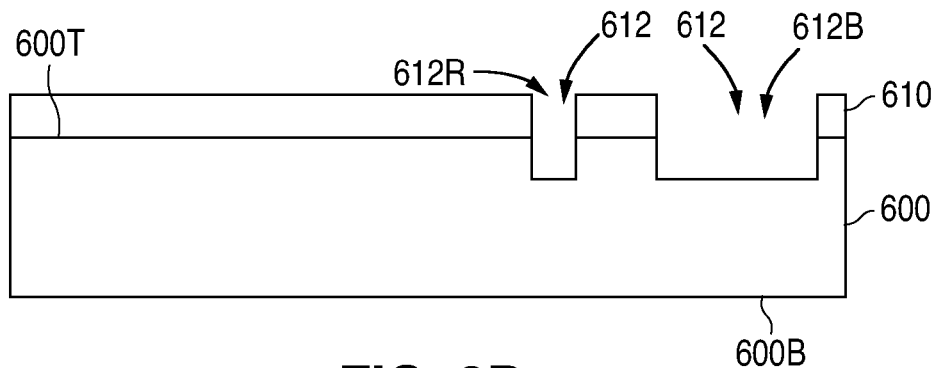

As further shown in FIG. 6A, the method begins with the front-side processing by forming a mask 610 on the top side of wafer 600 in a conventional manner. Following this, as shown in FIG. 6B, the exposed regions of wafer 600 are etched for a predetermined period of time to form a channel 612 that has a resistive section 612R with a narrow channel width and bond pad sections 612B that each has a wide channel width. Once channel 612 has been formed, mask 610 is removed in a conventional manner.

Figure 6C:
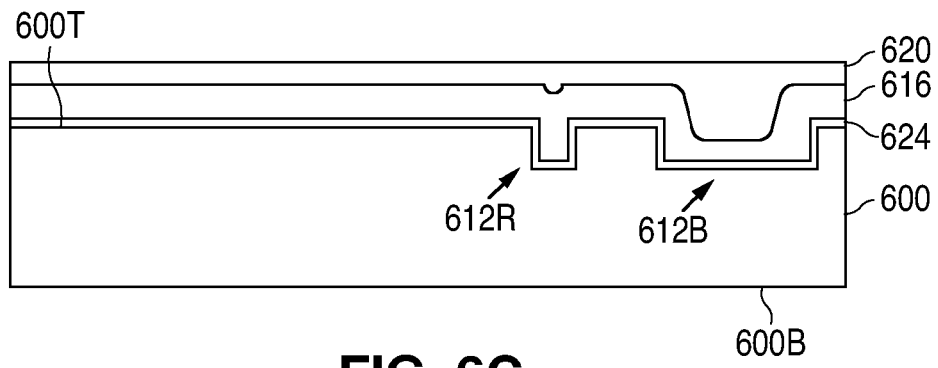

Following this, as shown in FIG. 6C, a diffusion barrier layer 614 is deposited onto the top surface of wafer 600 to line channel 612, followed by the deposition of an undoped polysilicon layer 616. Diffusion barrier layer 614 can be implemented with, for example, TaN or Ta. Polysilicon layer 616 is deposited to a depth that fills the narrow channel width of resistive section 612R, while only lining the wider bond pad sections 612B.

After polysilicon layer 616 has been formed, a metal layer 620 is formed on the top surface of polysilicon layer 616 to fill the remaining portions of the wider bond pad sections 612BP. Metal layer 620 can be formed by depositing a layer of metal or, alternately, by depositing a copper seed layer and then electroplating copper to form metal layer 620.

Figure 6D:
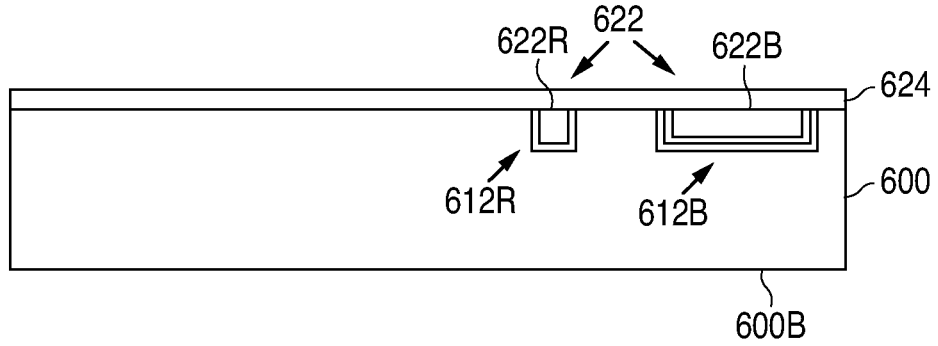

As shown in FIG. 6D, once metal layer 620 has been formed, the top surface of wafer 600 is planarized until the top surface of wafer 600 is exposed to form a heating element 622 that has a narrow resistive section 622R of polysilicon and a wider bond pad section 622B of metal surrounded by polysilicon. Following this, a diamond layer 624 is chemically vapor deposited onto the top surface 600T of wafer 600 and heating element 622 to form a portion of heat spreader 218.

Figure 6E:
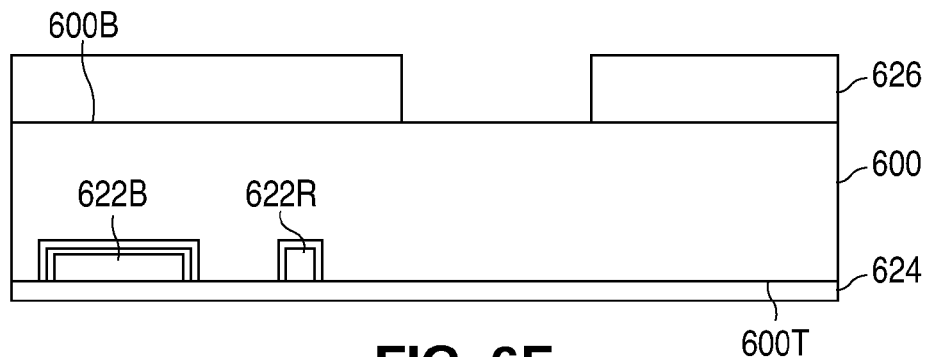
Figure 6F:
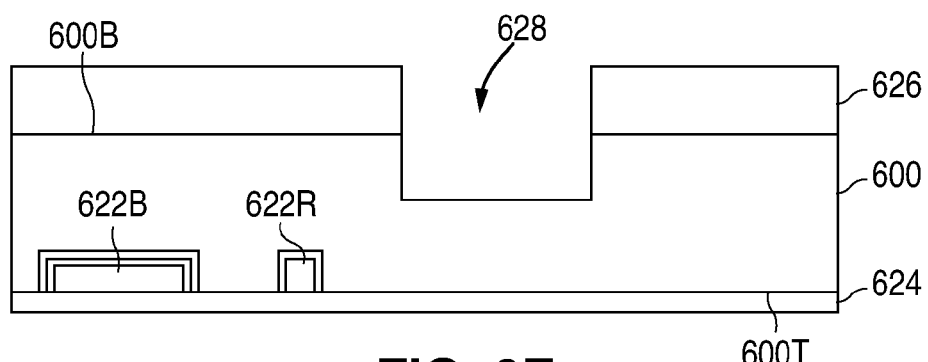

As shown in FIG. 6E, the method continues with the back-side processing by inverting wafer 600, and forming a mask 626 on the bottom side 600B of wafer 600 in a conventional manner. After mask 626 has been formed, as shown in FIG. 6F, the exposed region of wafer 600 is etched for a predetermined period of time to form a cavity 628. Mask 626 is then removed in a conventional manner.

Figure 6G:
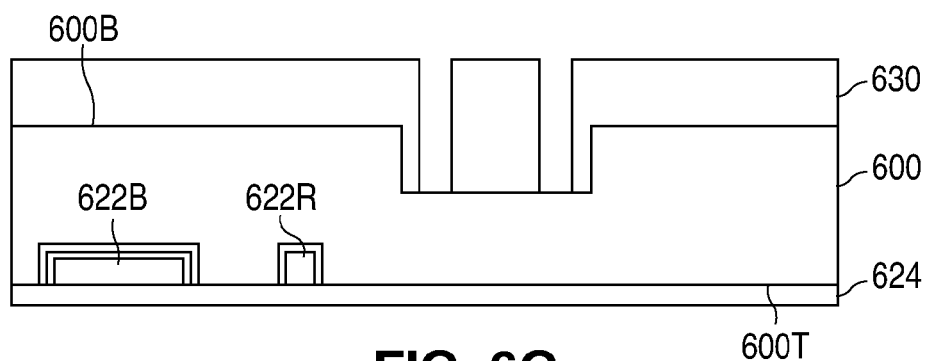
Figure 6H:
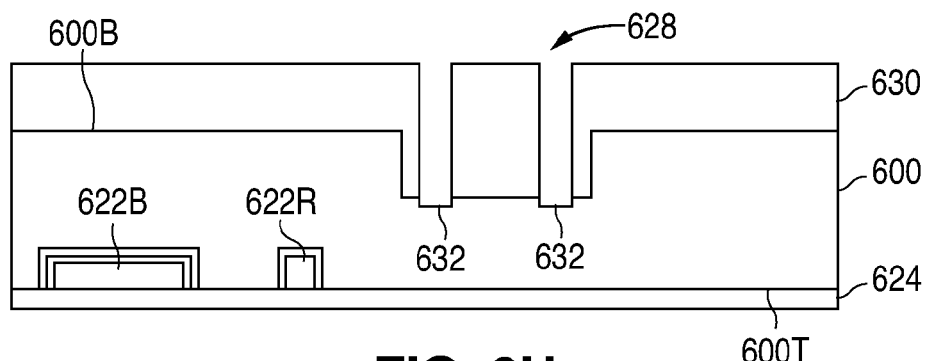

Following this, as shown in FIG. 6G, a mask 630 is formed on the bottom surface 600B of wafer 600 and cavity 628. After mask 630 has been formed, as shown in FIG. 6H, the exposed region of wafer 600 is etched for a predetermined period of time to form a number of glue channels 632 in the bottom surface of cavity 628. Mask 630 is then removed in a conventional manner.

Figure 6I:
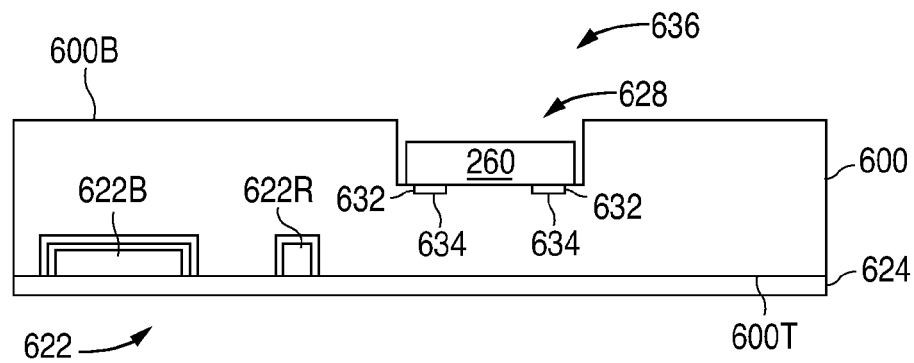

As shown in FIG. 6I, after the front-side and back-side processing is complete, a glue drop 634 is inserted into each glue channel 632 using a syringe with a conventional pick-and-place machine, and an optics package 260 is placed into cavity 628 with a conventional pick-and-place machine and attached to cavity 628 by way of glue drop 634 to form a second fabricated wafer 636.

In addition, lower RF coil 310 of atomic magnetometer 300 can be formed at the same time that heating element 622 is formed, except that all of the channel that is etched in wafer 600 for lower RF coil 310 has the wider width so that lower RF coil 310 is implemented with metal surrounded by polysilicon.

Figure 7:
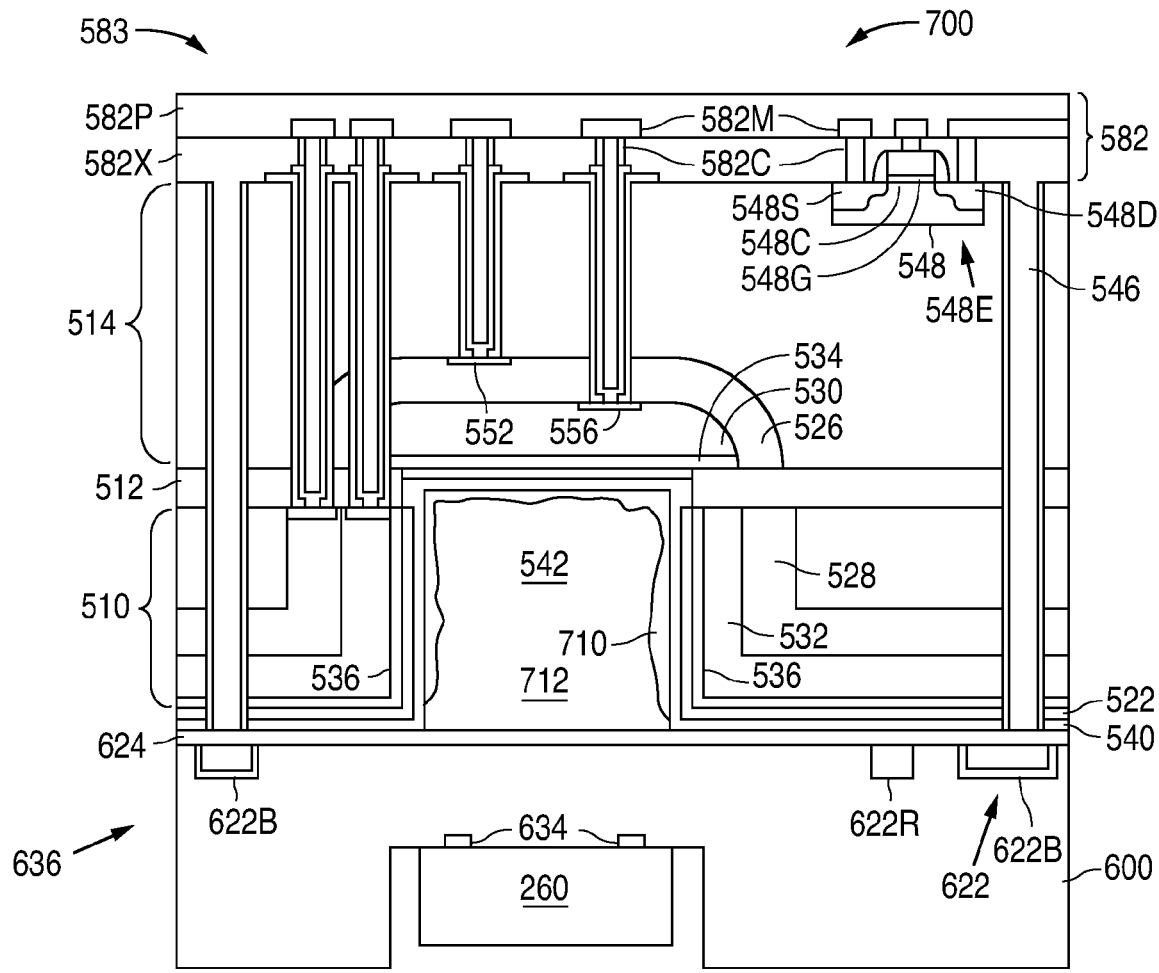
FIG. 7 is a cross-sectional view illustrating an example of the formation of a stacked wafer 700 in accordance with the present invention.

FIG. 7 shows a cross-sectional view that illustrates an example of the formation of a stacked wafer 700 in accordance with the present invention. As shown in FIG. 7, stacked wafer 700 is formed by first placing a substance 710, such as cesium azide, which can be decomposed by ultraviolet (UV) light into alkali and barrier atoms, into cavity 542 of first fabricated wafer 583. Substance 710 can be applied with a water mixture to increase the accuracy of the amount of substance 710 that is deposited. If substance 710 is applied with a water mixture, then wafer 583 is dried to remove the water.

Next, second fabricated wafer 636 is aligned with first fabricated wafer 583, and the two wafers are anodically bonded together in a conventional manner to close cavity 542, form a hermetically sealed vapor cell 712 and stacked wafer 700. Following this, stacked wafer 700 is exposed to UV light which decomposes substance 710 into a gas having alkali and barrier atoms.

Figure 8:
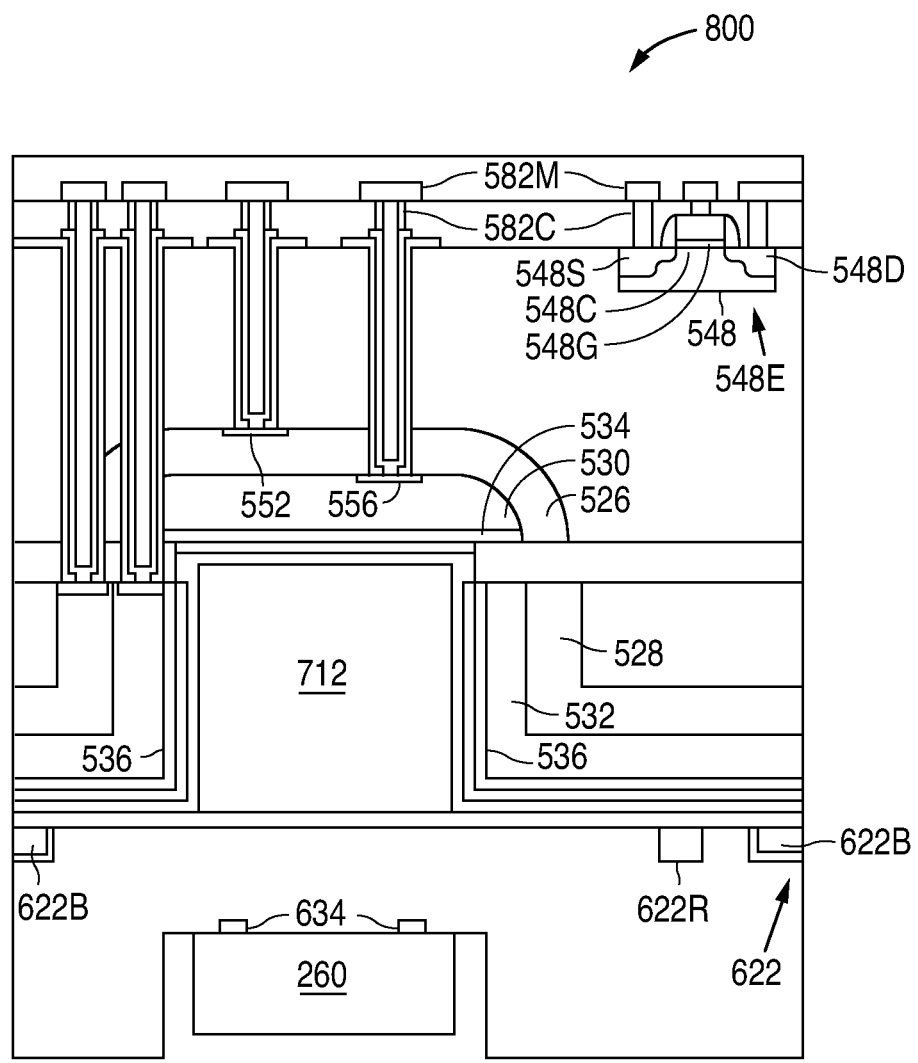
FIG. 8 is a cross-sectional view illustrating an example of the formation of a stacked die 800 in accordance with the present invention.

FIG. 8 shows a cross-sectional view that illustrates an example of the formation of a stacked die 800 in accordance with the present invention. As shown in FIG. 8, stacked die 800 is formed by dicing stacked wafer 700 so that the wafer saw passes through the through-the-wafer openings 546. As a result, as further shown in FIG. 8, the dicing exposes the bond pads sections 622B, thereby making bond pad sections 622B available for subsequent wire bonding.

Figure 9A:
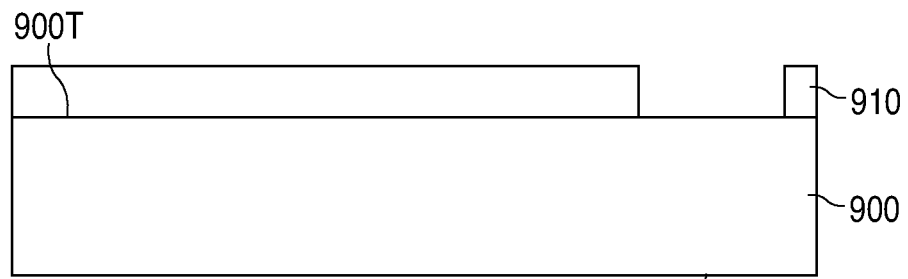
FIGS. 9A-9Q are a series of cross-sectional views illustrating an example of a method of forming a third wafer in accordance with the present invention.
Figure 9B:
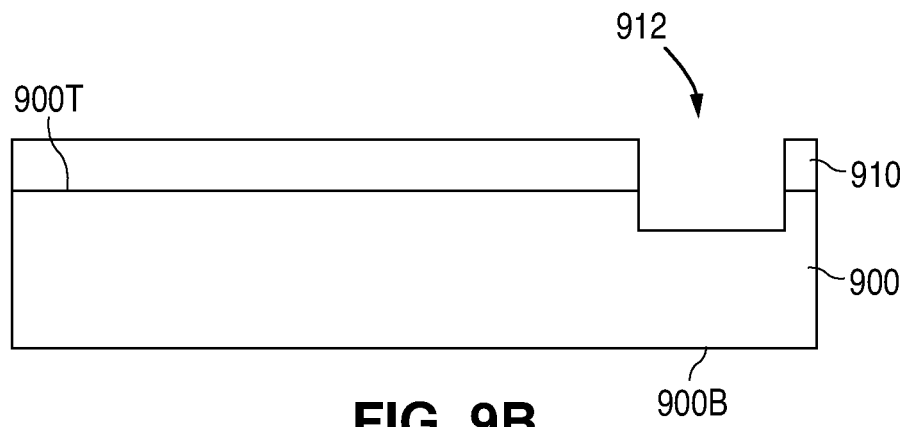
Figure 9C:
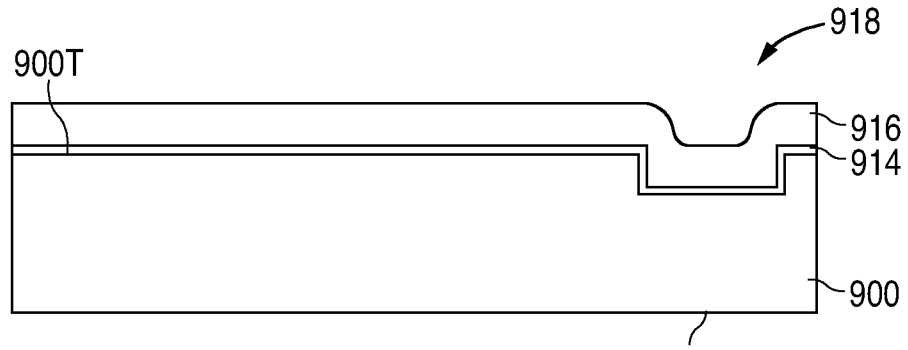
Figure 9D:
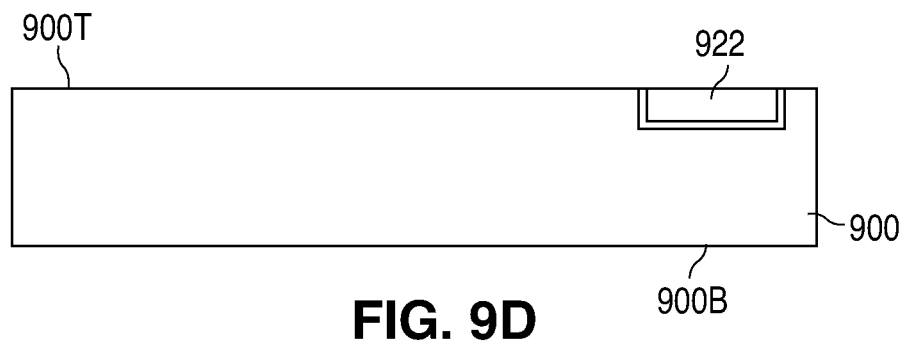
Figure 9E:
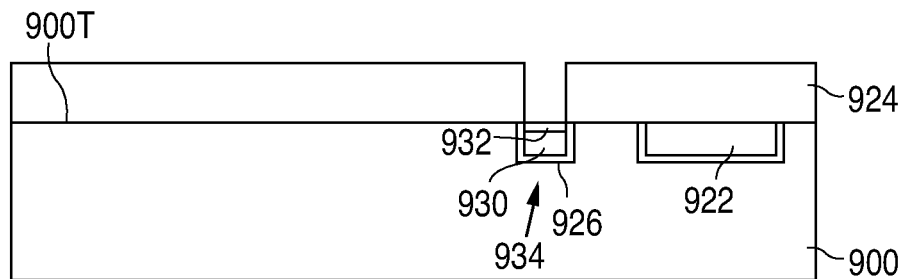
Figure 9F:
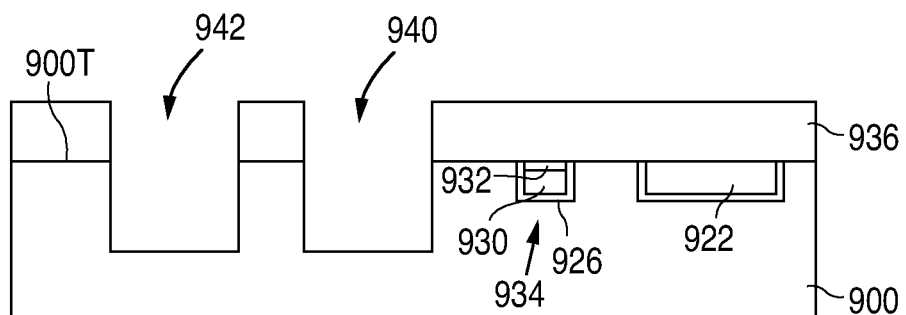
Figure 9G:
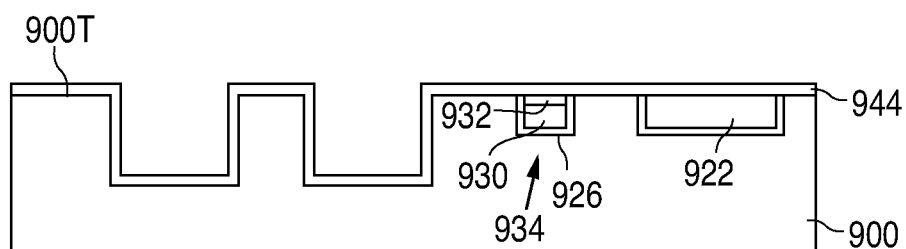
Figure 9H:
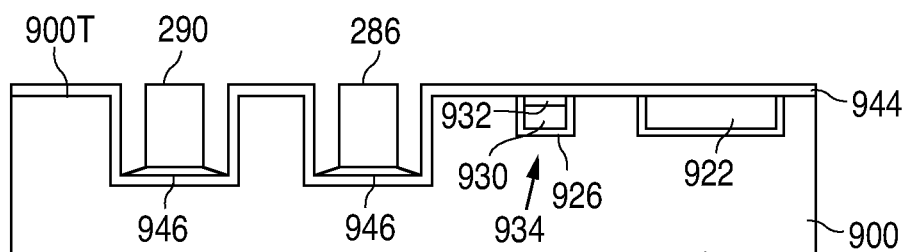
Figure 9I:
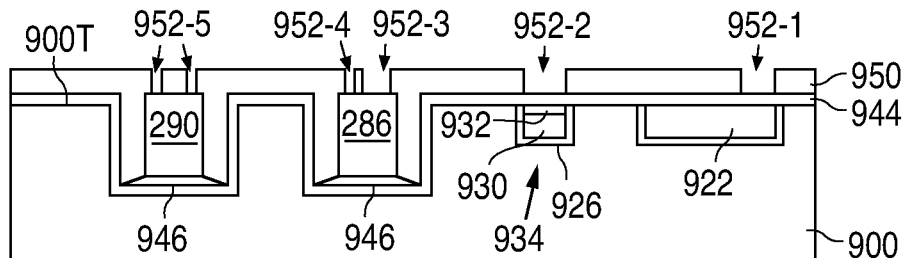
Figure 9J:
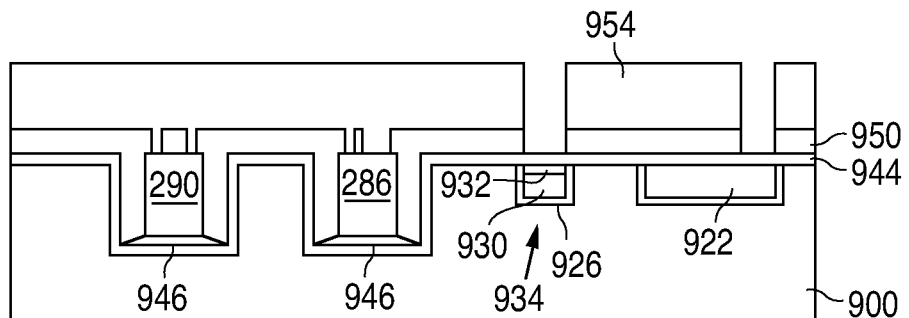
Figure 9K:
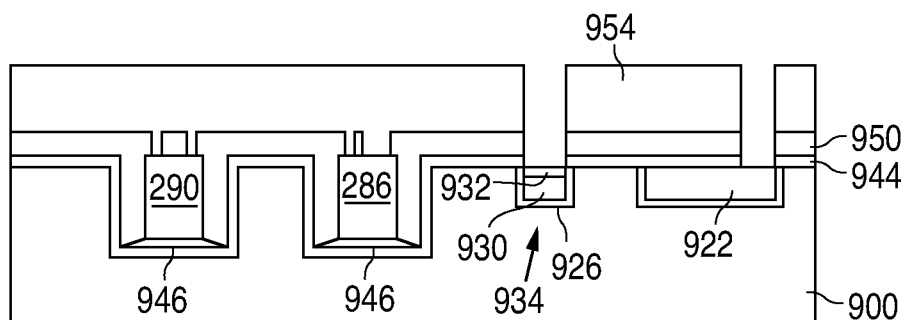
Figure 9L:
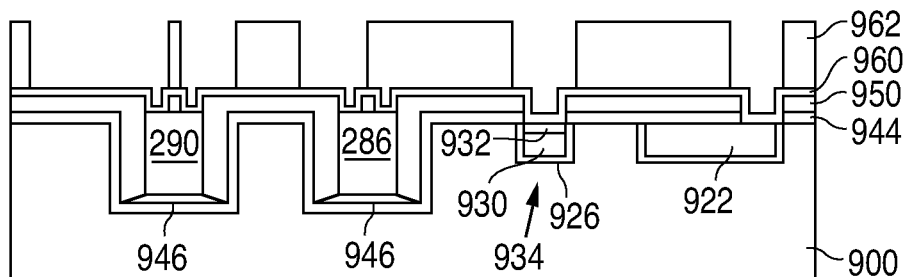
Figure 9M:
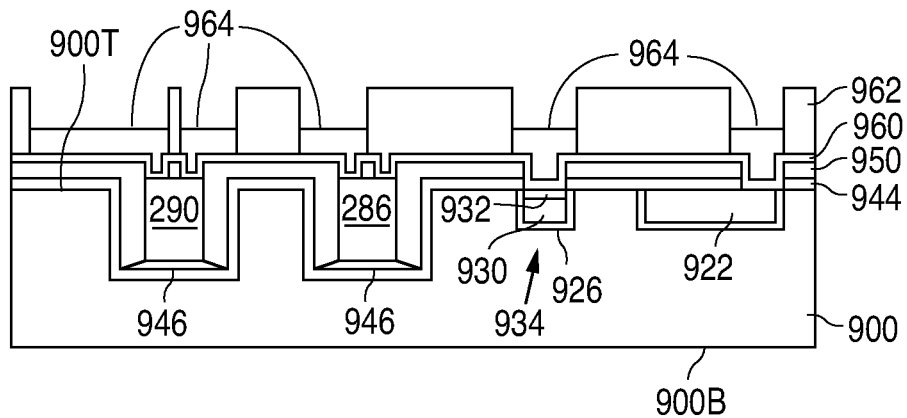
Figure 9N:
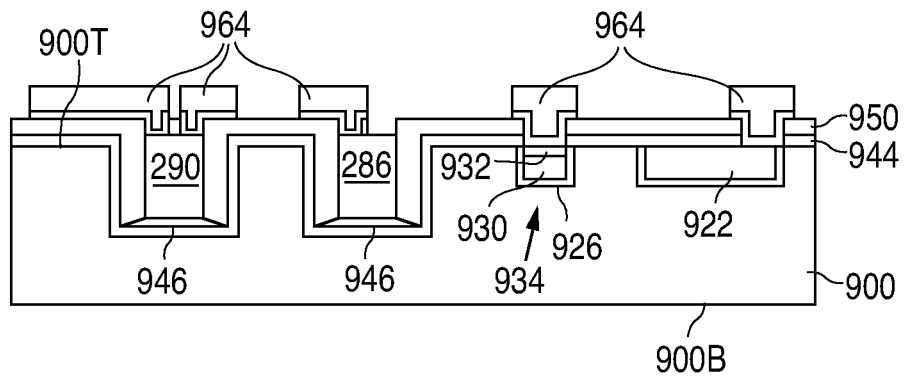
Figure 9O:
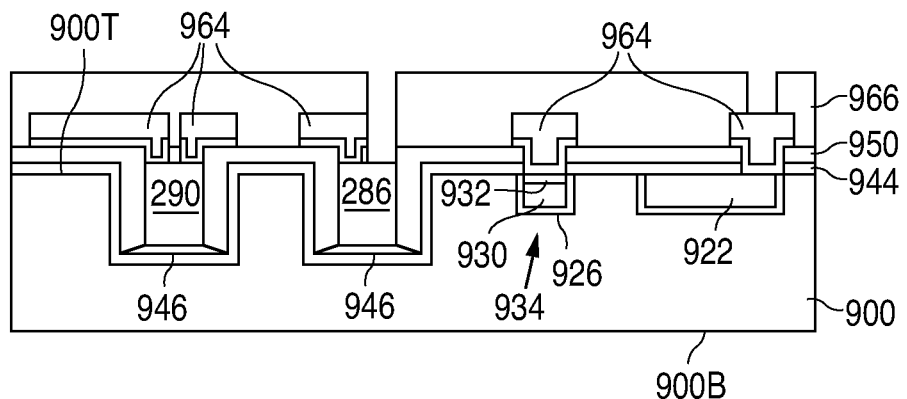
Figure 9P:
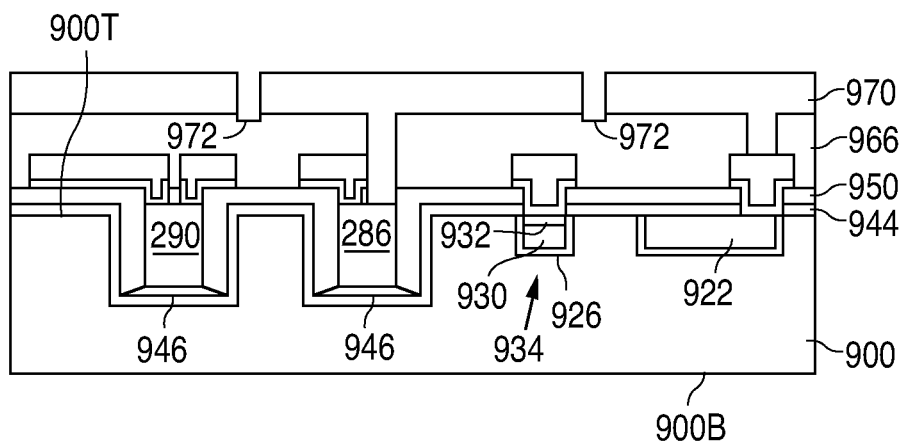
Figure 9Q:
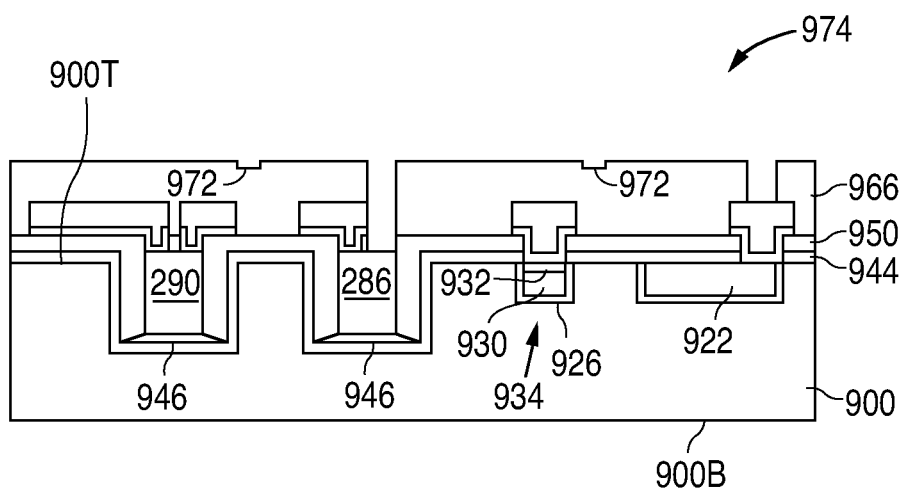

FIGS. 9A-9Q show a series of cross-sectional views that illustrate an example of a method of forming a third wafer in accordance with the present invention. As shown in FIG. 9A, the method utilizes a conventionally formed p− single-crystal silicon wafer 900 that has a top surface 900T and a bottom surface 900B. In the present example, wafer 900 is polished on only one side.

As further shown in FIG. 9A, the method begins by forming a mask 910 on the top side 900T of wafer 900 in a conventional manner. Following this, as shown in FIG. 9B, the exposed regions of wafer 900 are etched for a predetermined period of time to form a channel 912. Once channel 912 has been formed, mask 910 is removed in a conventional manner.

Following this, as shown in FIG. 9C, an oxide layer 914 is formed on the top surface 900T of wafer 900 to line channel 912, followed by the deposition of an undoped polysilicon layer 916. Polysilicon layer 916 is deposited to a depth that fills channel 912. As shown in FIG. 9D, once polysilicon layer 916 has been formed, the top surface 900T of wafer 900 is planarized until the top surface of wafer 900 is exposed to form a heating element 922. Heating element 922 forms heating element 280.

Next, as shown in FIG. 9E, a mask 924 is formed on the top surface 900T of wafer 900 and on heating element 922. After mask 924 has been formed, the exposed regions of p-type wafer 900 are implanted with a p-type dopant, such as boron, and then driven in to form a p− well 926. P-well 926 has a dopant concentration that is greater than the dopant concentration of p− wafer 900.

Once p− well 926 has been formed, an n-type material, such as phosphorous, is implanted with a lower implant energy and driven in to form an n-type region 930 in p– well 926. Following this, an n-type dopant is implanted with a lower implant energy and driven in to form a thin n+ contact layer 932 and a temperature sensing diode 934. Mask 924 is then removed in a conventional manner. Temperature sensing diode 934 is temperature sensor 282.

As shown in FIG. 9F, a mask 936 is formed on the top surface 900T of wafer 900, heating element 922, and diode 934 in a conventional manner. After mask 936 has been formed, the exposed regions of p– wafer 900 are etched for a predetermined period of time to form a first cavity 940 and a second cavity 942. Mask 936 is then removed in a conventional manner. Rather than being formed at the same time, the first and second cavities 940 and 942 can be formed in separate masking and etching steps if the first and second cavities 940 and 942 require different depths.

Following this, as shown in FIG. 9G, a diamond layer 944 is chemically vapor deposited in a conventional manner on heating element 922, diode 934, and the exposed regions of the top surface 900T of wafer 900 to line cavities 940 and 942. After this, as shown in FIG. 9H, a number of glue drops 946 are inserted into the first and second cavities 940 and 942 using a syringe with a conventional pick-and-place machine. Following this, VCSEL 286 and integrated circuit 290 are placed into cavity 940 and cavity 942, respectively, with a conventional pick-and-place machine, and attached to cavity 940 and cavity 942, respectively, by way of the glue drops 946.

In addition, lower ferrite block 413 of atomic magnetometer 400 can be incorporated in the same way that VCSEL 286 and integrated circuit 290 are incorporated, i.e., etch a third cavity when the first and second cavities 940 and 942 are formed, and insert lower ferrite block 413 into a glued third cavity with a pick-and-place machine.

As shown in FIG. 9I, after VCSEL 286 and integrated circuit 290 have been placed into and attached to cavity 940 and cavity 942, respectively, an epoxy layer, such as SU-8, is formed to touch diamond layer 944 and fill the remaining areas of the first and second cavities 940 and 942.

The epoxy layer is then exposed with a pattern and cured to form a substantially planar non-conductive structure 950. The pattern forms a number of openings in non-conductive structure 950, including a heating element opening 952-1, a temperature sensor diode opening 952-2, a laser opening 952-3 for the light output by VCSEL 286, a number of first operating openings 952-4 that expose the external pads of VCSEL 286, and a number of second operating openings 952-5 that expose the external pads of integrated circuit 290.

As shown in FIG. 9J, after non-conductive structure 950 has been formed, a mask 954 is formed on non-conductive structure 950 to expose heating element opening 952-1 and temperature sensor diode opening 952-2. After mask 954 has been formed, as shown in FIG. 9K, the exposed portions of diamond layer 944 are etched to expose regions of heating element 922 and n+ contact layer 932. Following this, mask 954 is removed in a conventional manner.

Next, as shown in FIG. 9L, a seed layer 960 is deposited to touch non-conductive structure 950 and the exposed regions of heating element 922, n+ contact layer 932, the external pads of VCSEL 286, and the external pads of integrated circuit 290. For example, seed layer 960 can be formed by depositing 300Å of titanium, 3000Å of copper, and 300Å of titanium. Once seed layer 960 has been formed, a plating mold 962 is formed on the top surface of seed layer 960.

As shown in FIG. 9M, following the formation of plating mold 962, the top titanium layer is stripped and copper is deposited by electroplating to form a number of metal-1 traces 964. As shown in FIG. 9N, after the electroplating, plating mold 962 and the underlying regions of seed layer 960 are removed to expose the metal-1 traces 964.

As shown in FIG. 9O, after the metal-1 traces 964 have been formed, a passivation layer 966 is formed on non-conductive structure 950 and the metal-1 traces 964. Passivation layer 966 can be formed in a number of ways. For example, passivation layer 966 can be implemented with a layer of oxide and an overlying layer of nitride, followed by an etch to expose the laser light opening of VCSEL 286 and the regions of the metal-1 traces 964 that function as bond pads.

Alternately, an epoxy layer, such as SU-8, can be deposited, exposed with a pattern, and then cured to form a substantially planar non-conductive structure. The pattern forms a number of openings in the non-conductive structure, including an opening that exposes the laser light opening of VCSEL 286 and the regions of the metal-1 traces 964 that function as bond pads.

As shown in FIG. 9P, after passivation layer 966 has been formed, a mask 970 is formed on passivation layer 966. After mask 970 has been formed, the exposed portions of passivation layer 966 are etched to form glue channels 972 in the top surface of passivation layer 966. Following this, mask 970 is removed in a conventional manner. As shown in FIG. 9Q, the removal of mask 970 forms a third fabricated wafer 974.

One of the advantages of the present invention is that the present invention integrates heating element 922, heat spreader 944, and VCSEL 286 (which requires heat to be tuned to the proper light frequency) into a single die-sized region. Further, the placement of VCSEL 286 in a cavity and the use of a highly-thermally conductive heat spreader (diamond layer 944) to line the cavity allows more heat to be delivered to VCSEL 286. In addition, the present invention utilizes thermally-sensitive diodes 934 to monitor the temperature of VCSEL 286.

The cross-sectional view shown in FIG. 9Q illustrates only one magnetometer section of a large number of magnetometer sections that are formed on wafer 900. After the fabrication of third fabricated wafer 974, a drop of glue, such as glue drop 273, is inserted into the glue channels 972 with a conventional pick-and-place machine.

Following this, a stacked die 800 is placed onto each magnetometer section of wafer 900 with a conventional pick-and-place machine, and attached to each magnetometer section by way of the glue drops 273. After a stacked die 800 has been attached to each magnetometer section of wafer 900, wafer 900 is diced in a conventional manner to form the individual atomic magnetometers 200, 300, and 400.

Thus, a die-sized atomic magnetometer and a method of forming the die-sized atomic magnetometer have been described. One of the advantages of the present invention is that the present invention provides a method of forming atomic magnetometers that allows atomic magnetometers to be mass produced in conventional integrated circuit fabrication facilities. As a result, the present invention significantly reduces the cost of atomic magnetometers. Another advantage of the present invention is the small size of the atomic magnetometers. Thus, the present invention allows atomic magnetometers to be incorporated into many more applications than were possible with conventional magnetometers.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A magnetometer comprising:

a first die having a top surface, a bottom surface, and a first die cavity that extends into the first die from the bottom surface of the first die, the first die cavity having a top surface and a side wall surface, the top surface of the first die cavity lying below and spaced apart from the top surface of the first die; and a second die having a top surface, a bottom surface, and a second die cavity that extends into the second die from the bottom surface of the second die, the second die cavity having a top surface and a side wall surface, the top surface of the second die cavity lying below and spaced apart from the top surface of the second die, the top surface of the second die touching the bottom surface of the first die to close the first die cavity and form a hermetically sealed cell:

wherein the first die includes a first semiconductor structure having a top surface, a bottom surface, and a first semiconductor cavity that extends into the first semiconductor structure from the bottom surface of the first semiconductor structure, the first semiconductor cavity having a top surface and a side wall surface, the top surface of the first semiconductor cavity lying below and spaced apart from the top surface of the first semiconductor structure; and wherein the first semiconductor structure includes an upper photo detector that lies vertically between the top surface of the first semiconductor structure and the top surface of the first semiconductor cavity, the first photo detector having a first well of a first conductivity type and a first region of a second conductivity type that touches the first well.

2. The magnetometer of claim 1 and further comprising a gas contained within the hermetically sealed cell, the gas including alkali atoms and buffer atoms.

3. The magnetometer of claim 1 wherein the second die includes an optics package attached to the top surface of the second die cavity, the optics package including a circular polarizer.

4. The magnetometer of claim 3 wherein the second die includes a second semiconductor structure having a top surface, a bottom surface, and a second semiconductor cavity that extends into the second semiconductor structure from the bottom surface of the second semiconductor structure, the second semiconductor structure further including a coil that touches the second semiconductor structure.

5. The magnetometer of claim 1 and further comprising:

a third die having a top surface, a bottom surface, and a third die cavity that extends into the third die from the top surface of the third die, the top surface of the third die being attached to the bottom surface of the second die; and a laser attached to a bottom surface of the third die cavity.

6. The magnetometer of claim 1 wherein the first semiconductor structure further includes a side wall photo detector that lies laterally adjacent to the side wall surface of the first semiconductor cavity, the side wall photo detector having a second well of the first conductivity type and a second region of the second conductivity type that touches the second well.

7. The magnetometer of claim 6 wherein the first semiconductor structure further includes:

a first conductive structure that extends from the top surface of the first semiconductor structure down into the first semiconductor structure to make an electrical connection with the first well;

a second conductive structure that extends from the top surface of the first semiconductor structure down into the first semiconductor structure to make an electrical connection with the second well;

a third conductive structure that extends from the top surface of the first semiconductor structure down into the first semiconductor structure to make an electrical connection with the first region;

a fourth conductive structure that extends from the top surface of the first semiconductor structure down into the first semiconductor structure to make an electrical connection with the second region; and an electronic circuit that touches the top surface of the first semiconductor structure.

8. The magnetometer of claim 7 wherein the first die further includes an interconnect structure that touches the top surface of the first semiconductor structure, the interconnect structure electrically connecting the electronic circuit to the first, second, third, and fourth conductive structures and to a number of external electrical connections.

9. The magnetometer of claim 8 wherein the first die further includes a mirror that touches a top surface of the interconnect structure.

10. The magnetometer of claim 9 wherein the first die further includes an RF coil structure that touches a top surface of the interconnect structure, the RF coil structure having a number of spaced apart coils that lie in a common plane.

11. A magnetometer comprising:

a first die having a top surface, a bottom surface, and a first die cavity that extends into the first die from the bottom surface of the first die, the first die cavity having a top surface and a side wall surface, the top surface of the first die cavity lying below and spaced apart from the top surface of the first die; and a second die having a top surface, a bottom surface, and a second die cavity that extends into the second die from the bottom surface of the second die, the second die cavity having a top surface and a side wall surface, the top surface of the second die cavity lying below and spaced apart from the top surface of the second die, the top surface of the second die touching the bottom surface of the first die to close the first die cavity and form a hermetically sealed cell, wherein the first die includes:

a first semiconductor structure having a top surface, a bottom surface, and a first semiconductor cavity that extends into the first semiconductor structure from the bottom surface of the first semiconductor structure, the first semiconductor cavity having a top surface and a side wall surface, the top surface of the first semiconductor cavity lying below and spaced apart from the top surface of the first semiconductor structure; and a heat spreader that touches the bottom surface of the first semiconductor structure and the top surface and the side wall surface of the first semiconductor cavity to line the first semiconductor cavity, the heat spreader being thermally conductive.

12. The magnetometer of claim 11 wherein the first semiconductor structure includes:

an upper photo detector that lies vertically between the top surface of the first semiconductor structure and the top surface of the first semiconductor cavity, the first photo detector having a first well of a first conductivity type and a first region of a second conductivity type that touches the first well; and a side wall photo detector that lies laterally adjacent to the side wall surface of the first semiconductor cavity, the side wall photo detector having a second well of the first conductivity type and a second region of the second conductivity type that touches the second well.

13. The magnetometer of claim 12 wherein the first semiconductor structure further includes:
   a first conductive structure that extends from the top surface of the first semiconductor structure down into the first semiconductor structure to make an electrical connection with the first well;
   a second conductive structure that extends from the top surface of the first semiconductor structure down into the first semiconductor structure to make an electrical connection with the second well;
   a third conductive structure that extends from the top surface of the first semiconductor structure down into the first semiconductor structure to make an electrical connection with the first region;
   a fourth conductive structure that extends from the top surface of the first semiconductor structure down into the first semiconductor structure to make an electrical connection with the second region; and
   an electronic circuit that touches the top surface of the first semiconductor structure.

14. The magnetometer of claim 13 wherein the first die further includes an interconnect structure that touches the top surface of the first semiconductor structure, the interconnect structure electrically connecting the electronic circuit to the first, second, third, and fourth conductive structures and to a number of external electrical connections.

15. The magnetometer of claim 14 wherein the first die further includes a mirror that touches a top surface of the interconnect structure.

16. The magnetometer of claim 14 wherein the first die further includes an RF coil structure that touches a top surface of the interconnect structure, the RF coil structure having a number of spaced apart coils that lie in a common plane.

17. The magnetometer of claim 11 wherein the heat spreader include a diamond layer.

18. A magnetometer comprising:
   a first die having a top surface, a bottom surface, and a silicon-on-insulator (SOI) structure, the SOI structure having a silicon bulk region, an insulator, and a silicon active region, the first die further having a first die cavity that extends through the silicon bulk region and insulator to expose a bottom surface of the silicon active region, the first die cavity having a top surface and a side wall surface, the top surface of the first die cavity lying below and spaced apart from the top surface of the first die; and
   a second die having a top surface, a bottom surface, and a second die cavity that extends into the second die from the bottom surface of the second die, the second die cavity having a top surface and a side wall surface, the top surface of the second die cavity lying below and spaced apart from the top surface of the second die, the top surface of the second die touching the bottom surface of the first die to close the first die cavity and form a hermetically sealed cell, wherein the second die includes a semiconductor structure.

19. The magnetometer of claim 18, further comprising a gas contained within the hermetically sealed cell, the gas including alkali atoms and buffer atoms.

20. The magnetometer of claim 18 wherein the first die includes a heat spreader that touches a bottom surface of the SOI structure and the top surface and the side wall surface of the first die cavity to line the first die cavity, the heat spreader being thermally conductive.

21. The magnetometer of claim 18 wherein the SOI structure includes:
   an upper photo detector that lies vertically between a top surface of the SOI structure and the top surface of the first die cavity, the first photo detector having a first well of a first conductivity type and a first region of a second conductivity type that touches the first well; and
   a side wall photo detector that lies laterally adjacent to the side wall surface of the first die cavity, the side wall photo detector having a second well of the first conductivity type and a second region of the second conductivity type that touches the second well.

22. The magnetometer of claim 21 wherein the SOI structure further includes:
   a first conductive structure that extends from the top surface of the SOI structure down into the SOI structure to make an electrical connection with the first well;
   a second conductive structure that extends from the top surface of the SOI structure down into the SOI structure to make an electrical connection with the second well;
   a third conductive structure that extends from the top surface of the SOI structure down into the SOI structure to make an electrical connection with the first region;
   a fourth conductive structure that extends from the top surface of the SOI structure down into the SOI structure to make an electrical connection with the second region; and
   an electronic circuit that touches the top surface of the SOI structure.

23. The magnetometer of claim 22 wherein the first die further includes an interconnect structure that touches the top surface of the SOI structure, the interconnect structure electrically connecting the electronic circuit to the first, second, third, and fourth conductive structures and to a number of external electrical connections.

24. The magnetometer of claim 23 wherein the first die further includes an RF coil structure that touches a top surface of the interconnect structure, the RF coil structure having a number of spaced apart coils that lie in a common plane.

* * * * *